US009621385B2

(12) United States Patent
Hollis

(10) Patent No.: US 9,621,385 B2
(45) Date of Patent: *Apr. 11, 2017

(54) METHODS AND APPARATUS TO REDUCE SIGNALING POWER

(71) Applicant: QUALCOMM Incorporated, San Diego, CA (US)

(72) Inventor: Timothy Mowry Hollis, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/855,115

(22) Filed: Sep. 15, 2015

(65) Prior Publication Data

US 2016/0006587 A1    Jan. 7, 2016

Related U.S. Application Data

(63) Continuation of application No. 14/089,683, filed on Nov. 25, 2013, now Pat. No. 9,172,567.

(51) Int. Cl.
*H04L 25/49* (2006.01)
*G06F 13/38* (2006.01)
*H03M 5/02* (2006.01)

(52) U.S. Cl.
CPC .......... *H04L 25/4917* (2013.01); *G06F 13/38* (2013.01); *H03M 5/02* (2013.01); *H04L 25/4915* (2013.01)

(58) Field of Classification Search
CPC ..... H04L 25/4915; H04L 25/14; H04L 25/49; H04L 25/4925; H04L 25/0272; H04L 25/4917; H03M 5/02; G06F 13/38
See application file for complete search history.

(56) References Cited

U.S. PATENT DOCUMENTS

| 5,910,967 | A | 6/1999 | Vanderaar |
| 6,484,283 | B2 * | 11/2002 | Stephen .............. H03M 13/258 714/786 |

(Continued)

FOREIGN PATENT DOCUMENTS

| JP | 2001186198 A | 7/2001 |
| JP | 2010212822 A | 9/2010 |

(Continued)

OTHER PUBLICATIONS

Co-pending U.S. Appl. No. 14/328,556, filed Jul. 10, 2014.

(Continued)

*Primary Examiner* — Syed Haider
(74) *Attorney, Agent, or Firm* — Loza & Loza, LLP

(57) ABSTRACT

System, methods and apparatus are described that reduce the power consumed by a multi-level encoded communications link. In one example, different logic states of a 4-level pulse amplitude modulation encoded transmission consume greater power than other logic states. The fraction of primary bits in a first logic state in multi-bit data symbols may determine whether the primary bits are inverted prior to transmission. The fraction of secondary bits in the first logic state in the multi-bit data symbols may determine whether the secondary bits are inverted prior to transmission. The primary bits may be swapped with the secondary bits is more secondary bits are in the first logic state than primary bits in the first logic state.

24 Claims, 19 Drawing Sheets

(56) References Cited

U.S. PATENT DOCUMENTS

| | | |
|---|---|---|
| 7,113,550 B2 | 9/2006 | Stonecypher et al. |
| 7,839,946 B2 | 11/2010 | Sada et al. |
| 8,320,494 B2 | 11/2012 | Zerbe et al. |
| 9,125,163 B2 | 9/2015 | Palanki et al. |
| 2002/0016945 A1* | 2/2002 | Sayood ............... H03M 7/4006 714/779 |
| 2002/0138539 A1 | 9/2002 | Pham et al. |
| 2002/0153936 A1* | 10/2002 | Zerbe ..................... G11C 7/02 327/336 |
| 2003/0095606 A1* | 5/2003 | Horowitz ........... H04L 25/4919 375/286 |
| 2004/0109509 A1* | 6/2004 | Stonecypher ....... H04L 25/4919 375/286 |
| 2008/0048730 A1 | 2/2008 | Bae |
| 2008/0056405 A1* | 3/2008 | Sada .................. H04L 25/4917 375/286 |
| 2008/0151988 A1 | 6/2008 | Agazzi et al. |
| 2011/0252171 A1* | 10/2011 | Dearth ................ G06F 13/4234 710/117 |
| 2013/0307708 A1 | 11/2013 | Hollis |
| 2015/0146816 A1 | 5/2015 | Hollis |

FOREIGN PATENT DOCUMENTS

| | | |
|---|---|---|
| KR | 20010057360 A | 7/2001 |
| KR | 20140115929 A | 10/2014 |
| WO | WO-2009064699 A1 | 5/2009 |

OTHER PUBLICATIONS

Goyal C., et al., "Low Power Data Bus Encoding & Decoding Schemes," Jul. 2007, 12 Pages.

International Search Report and Written Opinion—PCT/US2014/066891—ISA/EPO—Feb. 13, 2015.

Singh B., et al., "Low Power Bus Encoding Techniques for Memory Testing," Microelectronics and Solid State Electronics, 2013, vol. 2 (3), pp. 45-51.

* cited by examiner

METHODS AND APPARATUS TO REDUCE SIGNALING POWER

CROSS-REFERENCE TO RELATED APPLICATIONS

This application is a continuation of U.S. non-provisional patent application Ser. No. 14/089,683 filed in the United States Patent and Trademark Office on Nov. 25, 2013, the entire content of which is incorporated herein by reference for all applicable purposes.

BACKGROUND

Field

The present disclosure relates generally to high-speed data communications interfaces, and more particularly, to pulse amplitude modulation encoded data communication links.

Background

Manufacturers of mobile devices, such as cellular phones, may deploy various electronic components in one or more integrated circuit (IC) devices and/or on one or more circuit boards. The electronic components may include processing devices, storage devices, communications transceivers, display drivers, and the like. In one example, a processing device may be provided on a printed circuit board (PCB) and may communicate with one or more memory devices on the same PCB and/or on a different PCB. The processor may communicate with the memory devices using a high-speed communications link that supports unidirectional and bidirectional channels for data and control signals.

In a multi-wire interface, the power consumption associated with a communications link can be significant in relation to a power budget available in a mobile wireless device. The power consumed by the communications link may be determined to some extent by one or more of bus width, driver types used to transmit data on a transmission line, geometry and structure of the transmission line, encoding format, frequency of switching, logic states, which may be defined by voltage and current levels of an encoding scheme, and so on.

SUMMARY

Embodiments disclosed herein provide systems, methods and apparatus that can reduce power consumption in a data communications link. Power consumption may be reduced by limiting the number of occurrences of a high-power encoding state in a primary bit or a secondary bit of a multi-bit data symbol. The primary bit may be a bit of the multi-bit data symbol that has one or more signaling states which draw more power than the signaling states of other bits of the multi-bit data symbol, and the secondary bit may be another bit of the multi-bit data symbol which has signaling states that draw more power than the remaining bits of the multi-bit data symbol other than the primary bit. In some examples, the primary bit may be the most significant bit (MSB) or the least significant bit (LSB) of the multi-bit data symbol, and the secondary bit of the multi-bit data symbol may be any of a plurality of bits associated with the multi-bit data symbol, other than the primary bit.

In an aspect of the disclosure, a method for data communications includes determining a first fraction corresponding to a proportion of primary bits of a plurality of input data symbols that are in a first logic state and a second fraction corresponding to a proportion of secondary bits of the plurality of input data symbols that are in the first logic state, generating transmission symbols from the plurality of input data symbols, and providing the transmission symbols to one or more multi-state encoders configured to encode the transmission symbols as multi-level transmission symbols for transmission on a communications link. More power may be required to transmit a primary bit in the first logic state than to transmit a secondary bit in the first logic state. Primary bits of the transmission symbols may be derived from the secondary bits of the plurality of input data symbols and secondary bits of the transmission symbols may be derived from the primary bits of the plurality of input data symbols when the second fraction is greater than a half and greater than the first fraction.

In an aspect of the disclosure, generating transmission symbols from the plurality of input data symbols includes inverting the primary bits of the input data symbols when the first fraction is greater than a half, and inverting the secondary bits of the input data symbols when the second fraction is greater than a half.

In an aspect of the disclosure, generating transmission symbols from the plurality of input data symbols includes inverting the primary bits of the transmission symbols when the first fraction is greater than a half or the second fraction is greater than a half.

In an aspect of the disclosure, the primary bits and secondary bits are binary-encoded bits of a multi-bit data symbol, and wherein more power may be required to transmit a binary-encoded bit in the first logic state than to transmit a binary-encoded bit in a second logic state.

In an aspect of the disclosure, a sequence of the transmission symbols may be transmitted on a connector of the communications link. The transmission symbols may be transmitted in parallel on the communications link.

In an aspect of the disclosure, an encoding indicator signal may be provided to one of the one or more multi-state encoders to obtain a multi-level encoding indicator signal indicating whether the primary bits of the transmission symbols correspond to the secondary bits of the input data symbols and the secondary bits of the transmission symbols correspond to the primary bits of the input data symbols. The the multi-level encoding indicator signal and the multi-level transmission symbols may be transmitted in parallel in one transmission clock cycle on the communications link. The multi-level encoding indicator signal may indicate whether the primary bits of the transmission symbols are inverted. The multi-level encoding indicator signal may indicate whether the secondary bits of the transmission symbols are inverted. The one or more multi-state encoders may encode each of the transmission symbols as one of at least three voltage or current levels. The one or more multi-state encoders may encode each of the transmission symbols for transmission on a pulse amplitude modulated communications link.

In an aspect of the disclosure, an apparatus includes means for determining a fraction of primary bits of a plurality of multi-bit data symbols that are in a first logic state, and means for providing transmission symbols to a multi-state encoder. More power may be required to transmit a primary bit in the first logic state than a primary bit in a second logic state. More power may be required to transmit the primary bit in the first logic state than to transmit a secondary bit in any logic state. Each transmission symbol may include an inverted version of the primary bit of a corresponding one of the plurality of multi-bit data symbols when the fraction of primary bits is greater than a half. The multi state encoder may be configured to encode each of the plurality of multi-bit data symbols as one of at least three voltage or current levels on a communications link.

In an aspect of the disclosure, an apparatus, includes a multi-state encoder configured to encode each of a plurality of multi-bit data symbols as one of at least three voltage or current levels on a communications link, a plurality of multi-state transmitter circuits configured to receive a set of transmission symbols from the multi-state encoder, and a processing circuit. The processing circuit may be configured to determine a fraction of primary bits of a plurality of multi-bit data symbols that are in a first logic state, and provide the transmission symbols to the multi-state encoder. More power may be required to transmit a primary bit in the first logic state than a primary bit in a second logic state. More power may be required to transmit the primary bit in the first logic state than to transmit a secondary bit in any logic state. Each transmission symbol may include an inverted version of the primary bit of a corresponding one of the plurality of multi-bit data symbols when the fraction of primary bits is greater than a half.

In an aspect of the disclosure, a processor-readable storage medium has one or more instructions. The instructions may be executed by one or more processing circuits and may cause the one or more processing circuits to determine a fraction of primary bits of a plurality of multi-bit data symbols that are in a first logic state, and provide transmission symbols to a multi-state encoder. More power may be required to transmit a primary bit in the first logic state than a primary bit in a second logic state. More power may be required to transmit the primary bit in the first logic state than to transmit a secondary bit in any logic state. Each transmission symbol may include an inverted version of the primary bit of a corresponding one of the plurality of multi-bit data symbols when the fraction of primary bits is greater than a half. The multi-state encoder may be configured to encode each of the plurality of multi-bit data symbols as one of at least three voltage or current levels on a communications link.

In an aspect of the disclosure, a method includes decoding a multi-level encoding indicator signal received from a communications link to provide a plurality of control signals, selectively inverting a primary bit of data symbols decoded from one or more signals received from the communications link based on a first of the plurality of control signals, selectively inverting a secondary bit of the data symbols based on a second of the plurality of control signals, and selectively swapping the primary bit and the secondary bit based on a third of the plurality of control signals. More power may be required to transmit a primary bit or secondary bit in a first logic state than in a second logic state.

In an aspect of the disclosure, an apparatus includes means for determining a first fraction corresponding to a proportion of primary bits of a plurality of input data symbols that are in a first logic state and a second fraction corresponding to a proportion of secondary bits of the plurality of input data symbols that are in the first logic state, means for generating transmission symbols from the plurality of input data symbols, and means for providing the transmission symbols to one or more multi-state encoders configured to encode the transmission symbols as multi-level transmission symbols for transmission on a communications link. More power may be required to transmit a primary bit in the first logic state than to transmit a secondary bit in the first logic state. Primary bits of the transmission symbols may be derived from the secondary bits of the plurality of input data symbols and secondary bits of the transmission symbols may be derived from the primary bits of the plurality of input data symbols when the second fraction is greater than a half and greater than the first fraction.

In an aspect of the disclosure, transmission symbols may be generated from the plurality of input data symbols by inverting the primary bits of the input data symbols when the first fraction is greater than a half, and inverting the secondary bits of the input data symbols when the second fraction is greater than a half. In one example, the transmission symbols may be generated from the plurality of input data symbols by inverting the primary bits of the transmission symbols when the first fraction is greater than a half or the second fraction is greater than a half.

In an aspect of the disclosure, an apparatus includes a multi-state decoder configured to decode a multi-level encoding indicator signal received from a communications link and to provide a plurality of control signals extracted from the encoding indicator signal, and a processing circuit. The processing circuit may be configured to determine a first fraction corresponding to a proportion of primary bits of a plurality of input data symbols that are in a first logic state and a second fraction corresponding to a proportion of secondary bits of the plurality of input data symbols that are in the first logic state, generate transmission symbols from the plurality of input data symbols, and provide the transmission symbols to one or more multi-state encoders configured to encode the transmission symbols as multi-level transmission symbols for transmission on a communications link. More power may be required to transmit a primary bit in the first logic state than to transmit a secondary bit in the first logic state. Primary bits of the transmission symbols may be derived from the secondary bits of the plurality of input data symbols and secondary bits of the transmission symbols may be derived from the primary bits of the plurality of input data symbols when the second fraction is greater than a half and greater than the first fraction.

In an aspect of the disclosure, transmission symbols may be generated from the plurality of input data symbols by inverting the primary bits of the input data symbols when the first fraction is greater than a half, and inverting the secondary bits of the input data symbols when the second fraction is greater than a half. In one example, the transmission symbols may be generated from the plurality of input data symbols by inverting the primary bits of the transmission symbols when the first fraction is greater than a half or the second fraction is greater than a half.

In an aspect of the disclosure, a processor-readable storage medium has or maintains one or more instructions. The one or more instructions may be executed by at least one processing circuit. The one or more instructions may cause the at least one processing circuit to determine a first fraction corresponding to a proportion of primary bits of a plurality of input data symbols that are in a first logic state and a second fraction corresponding to a proportion of secondary bits of the plurality of input data symbols that are in the first logic state, generate transmission symbols from the plurality of input data symbols, and provide the transmission symbols to one or more multi-state encoders configured to encode the transmission symbols as multi-level transmission symbols for transmission on a communications link. More power may be required to transmit a primary bit in the first logic state than to transmit a secondary bit in the first logic state. Primary bits of the transmission symbols may be derived from the secondary bits of the plurality of input data symbols and secondary bits of the transmission symbols may be derived from the primary bits of the plurality of input data symbols when the second fraction is greater than a half and greater than the first fraction.

In an aspect of the disclosure, transmission symbols may be generated from the plurality of input data symbols by inverting the primary bits of the input data symbols when the first fraction is greater than a half, and inverting the secondary bits of the input data symbols when the second fraction is greater than a half. In one example, the transmission symbols may be generated from the plurality of input data symbols by inverting the primary bits of the transmission symbols when the first fraction is greater than a half or the second fraction is greater than a half.

DETAILED DESCRIPTION

Various aspects are now described with reference to the drawings. In the following description, for purposes of explanation, numerous specific details are set forth in order to provide a thorough understanding of one or more aspects. It may be evident, however, that such aspects) may be practiced without these specific details.

As used in this application, the terms "component," "module," "system" and the like are intended to include a computer-related entity, such as, but not limited to hardware, firmware, a combination of hardware and software, software or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Figure 1:
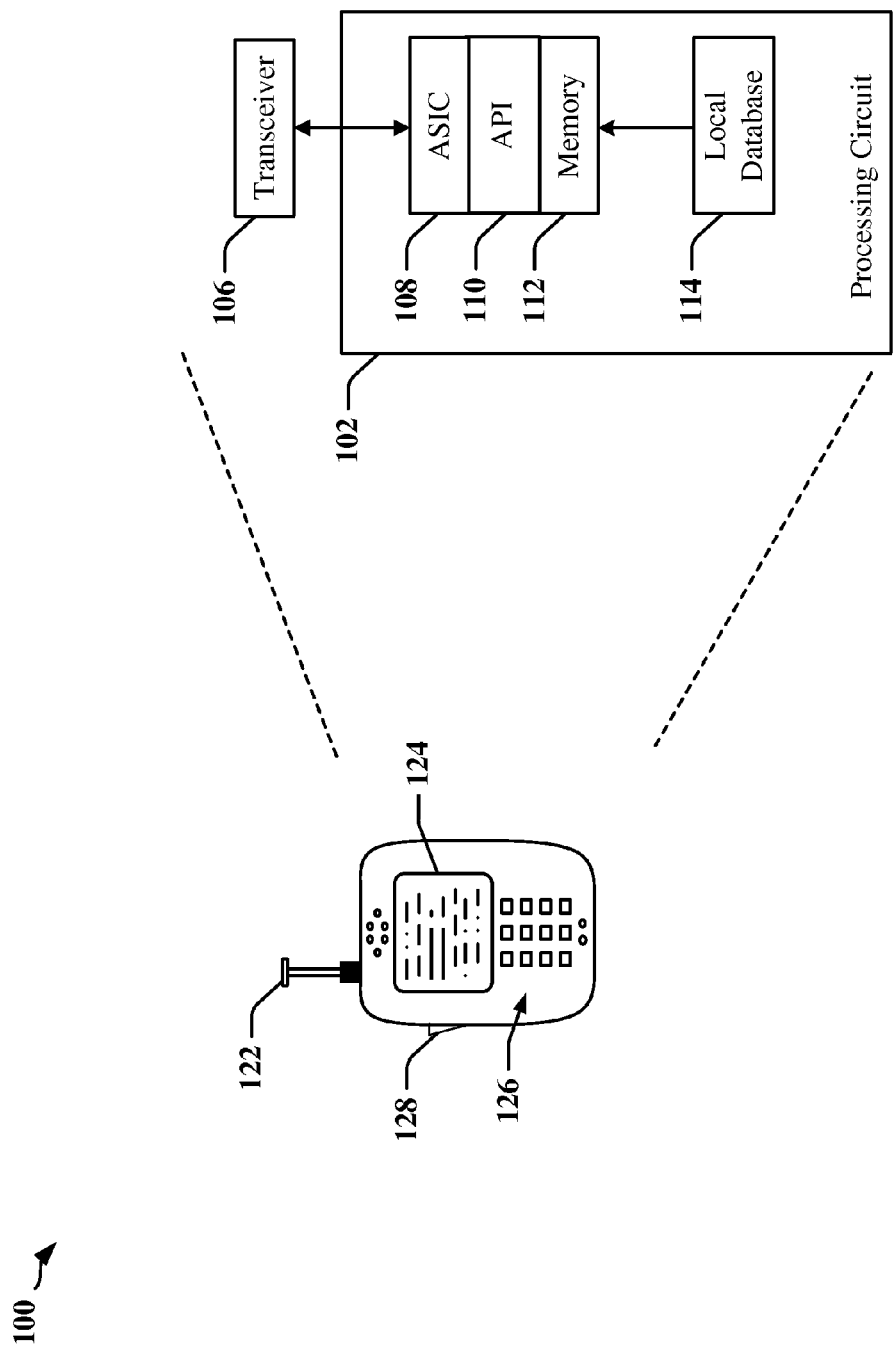
FIG. 1 depicts an apparatus employing a data link between IC devices that selectively operates according to one of a plurality of available standards.

Certain aspects of the invention may be applicable to communications links deployed between electronic devices that may include subcomponents of an apparatus such as a telephone, a mobile computing device, an appliance, automobile electronics, avionics systems, etc. FIG. 1 depicts an apparatus that may employ a communication link between IC devices. In one example, the apparatus 100 may comprise a wireless communication device that communicates through an RF transceiver with a radio access network (RAN), a core access network, the Internet and/or another network. The apparatus 100 may include a communications transceiver 106 operably coupled to processing circuit 102. The processing circuit 102 may comprise one or more IC devices, such as an application-specific IC (ASIC) 108. The ASIC 108 may include one or more processing devices, logic circuits, and so on. The processing circuit 102 may include and/or be coupled to processor readable storage such as a memory 112 that may maintain instructions and data the may be executed by processing circuit 102. The processing circuit 102 may be controlled by one or more of an operating system and an application programming interface (API) 110 layer that supports and enables execution of software modules residing in storage media, such as the memory device 112 of the wireless device. The memory device 112 may include read-only memory (ROM) or random-access memory (RAM), electrically erasable programmable ROM (EEPROM), flash cards, or any memory device that can be used in processing systems and computing platforms. The processing circuit 102 may include or access a local database 114 that can maintain operational parameters and other information used to configure and operate apparatus 100. The local database 114 may be implemented using one or more of a database module, flash memory, magnetic media, EEPROM, optical media, tape, soft or hard disk, or the like. The processing circuit may also be operably coupled to external devices such as an antenna 122, a display 124, operator controls, such as a button 128 and/or a keypad 126 among other components.

Various devices within the apparatus 100 may be interconnected using a communications link that includes a number of conductors. The communications link may include one or more of a cable, wires within a semiconductor package, metallization on an IC, and traces on a PCB or chip carrier. In some instances, data may be encoded on the communications link using multi-level signaling, such that multiple bits of data or control information may be transmitted in a single pulse or communications clock cycle. For example, pulse amplitude modulation (PAM) may be employed to connect memory devices such as double data rate synchronous dynamic random-access memory (DDR SDRAM) and other devices or circuits. Examples of PAM include 2-level PAM (2-PAM), 4-level PAM (4-PAM) and 8-level PAM (8-PAM), where the number of levels indicates the number of voltage or current levels available for encoding data or control information.

Figure 2:
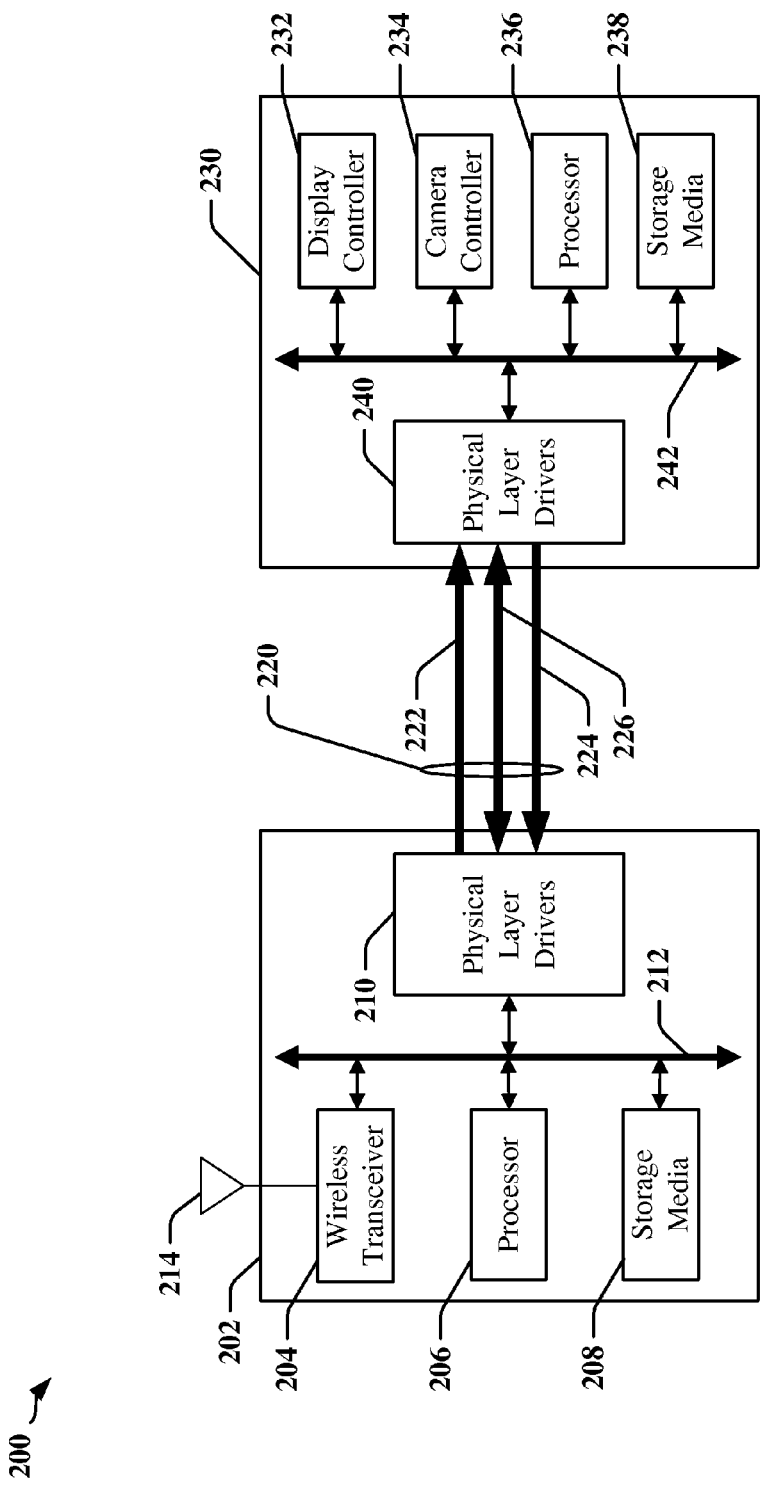
FIG. 2 illustrates a simplified system architecture for an apparatus employing a data link between IC devices.

FIG. 2 is a block schematic illustrating certain aspects of an apparatus 200 such as a wireless mobile device, a mobile telephone, a mobile computing system, a wireless telephone, a notebook computer, a tablet computing device, a media player, s gaming device, or the like. The apparatus 200 may comprise a plurality of IC devices 202 and 230 that exchange data and control information through a communications link 220. The communications link 220 may be used to connect two or more IC devices 202 and 230 that are located in close proximity to one another, or that are physically located in different parts of the apparatus 200. In one example, the communications link 220 may be provided on a chip carrier, substrate or circuit board that carries the IC devices 202 and 230. The IC devices 202, 203 may be an ASIC, a processing device, a storage device such as a dynamic random access memory (DRAM), a transceiver, interface controller or some combination of these or other devices. In another example, a first IC device 202 may be located in a keypad section of a flip-phone while a second IC device 230 may be located in a display section of the flip-phone. In another example, a portion of the communications link 220 may comprise a cable or optical connection.

The communications link 220 may comprise multiple individual data links 222, 224 and 226. One communications link 226 may include bidirectional connectors, and may operate in time division, half-duplex, full-duplex, or other modes. One or more communications links 222 and 224 may comprise unidirectional connectors. The communications link 220 may be asymmetrically configured, providing higher bandwidth in one direction and/or between different IC devices 202, 230. In one example, a first communications link 222 between two devices may be referred to as a forward link 222 while a second communications link 224 between the two devices may be referred to as a reverse link 224. In another example, a first IC device 202 may be designated as a host, manager, master and/or transmitter, while one or more other IC devices 230 may be designated as a client, slave and/or receiver, even if both IC devices 202 and 230 are configured to transmit and receive on the communications link 222.

The IC devices 202 and 230 may each comprise or cooperate with a general-purpose processor or other processing and/or computing circuit or device 206, 236 adapted to cooperate with various circuits and modules in order to perform certain functions disclosed herein. The IC devices 202, 230 may perform different functions and/or support different operational aspects of the apparatus 200. A plurality of IC devices, including the devices 202 and 230 may include modems, transceivers, display controllers, user interface devices, memory devices, processing devices, and so on. In one example, the first IC device 202 may perform core functions of the apparatus 200, including maintaining wireless communications through a wireless transceiver 204 and an antenna 214, while the second IC device 230 may support a user interface that manages or operates a display controller 232, and may control operations of a camera or video input device using a camera controller 234. Other features supported by one or more of the IC devices 202 and 230 may include a keyboard, a voice-recognition component, and other input or output devices. Display controller 232 may comprise circuits and software drivers that support displays such as a liquid crystal display (LCD) panel, touch-screen display, indicators and so on. The storage media 208 and 238 may comprise transitory and/or non-transitory storage devices adapted to maintain instructions and data used by the respective processors 206 and 16, and/or other components of the IC devices 202 and 230. The storage media 208 and 238 may include or cooperate with DRAM devices and other devices provided as one of the IC devices and/or externally of the IC devices 202, 230 and connected using the communications link 220.

Communication between each processor 206, 236 and corresponding internal, external and/or collocated storage media 208 and 238 and other modules and circuits may be facilitated by a bus 212, 242. Communication between each processor 206, 236 and its corresponding external storage media 208 and 238 and other modules and circuits may be facilitated by one or more communications links 222, 224, 226. Certain aspects disclosed herein are applicable to both the busses 212, 242 and the communications link 220. The communication link 220 and/or the busses 212, 242 may be operated to communicate control, command and other information between the first IC device 202 and the second IC device 230 in accordance with an industry or other standard. Industry standards may be application specific.

According to certain aspects disclosed herein, a data inversion (DI) encoding technique may be employed to conserve power in binary signaling topologies involving the parallel transmission of n-bit data. In one example, DI encoding may be applied to reduce the number of transmitted non-zero multi-bit symbols ('11', '10', or '01') in a 4-PAM binary signaling topology. In some instances, such as in ground-referenced, terminated, single-ended communications data links, data inversion can be limited to symbols in which a primary bit is set to logic '1' (e.g. '11' or '10' when the primary bit is the MSB to optimize power savings with minimal hardware complexity when the primary bit controls the higher levels of current or voltage.

The primary bit may be a bit of a multi-bit symbol that has one or more signaling states that draw more power than the corresponding signaling states of other bits of the multi-bit symbol. In some examples, the primary bit may be the MSB or the LSB of the multi-bit symbol. The secondary bit may be the LSB when the primary bit is the MSB. The secondary bit may be the MSB when the primary bit is the LSB. The secondary bit may be another bit in the multi-bit symbol. In some instances, the secondary bit may have signaling states that draw more power than the corresponding signaling states in other, remaining bits in the multi-bit symbol (i.e. other than the primary bit).

Figure 3:
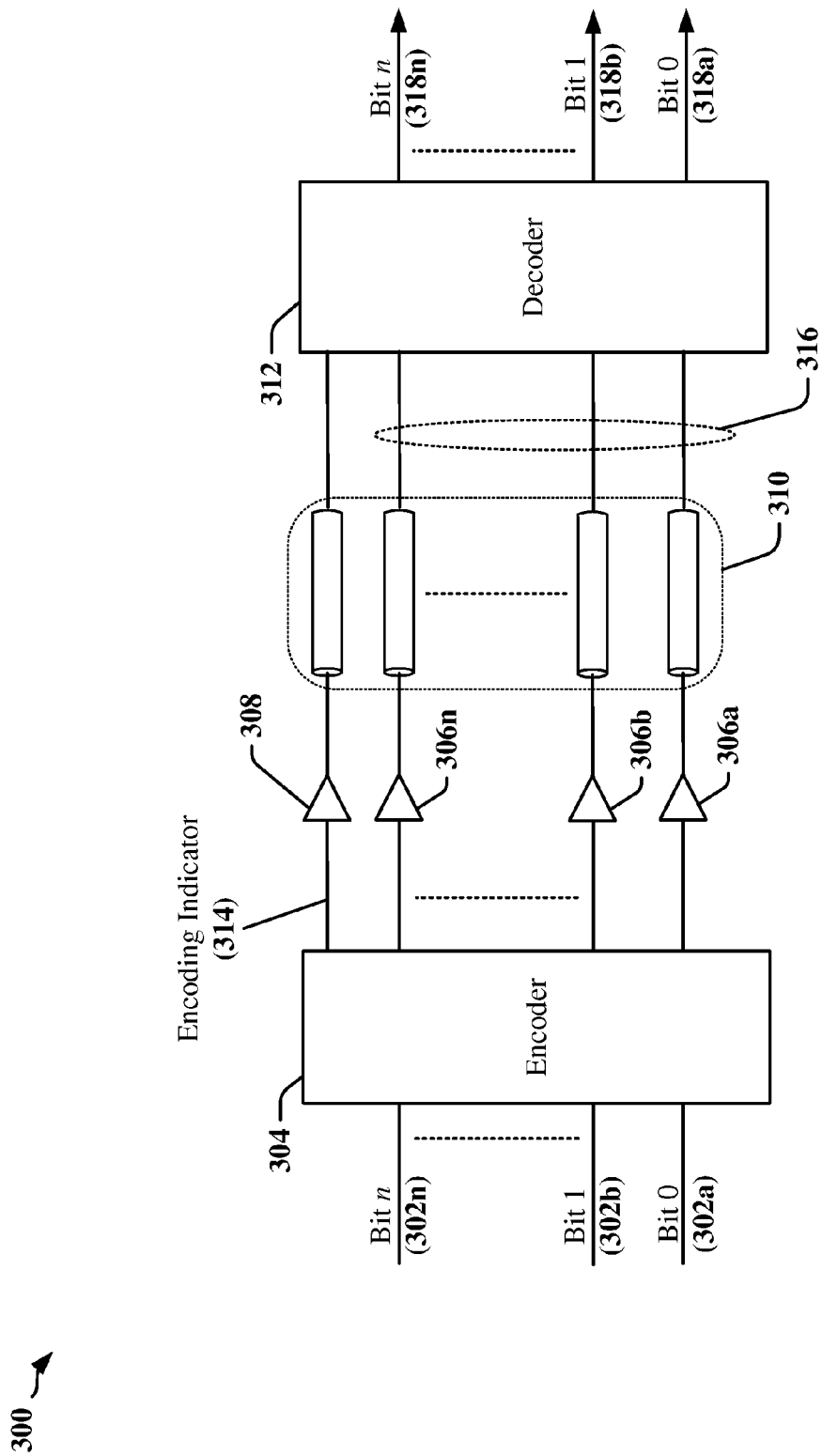
FIG. 3 illustrates an example of a communications link according to certain aspects disclosed herein.

FIG. 3 is a block schematic drawing illustrating a general example of a communications link 300 that may be implemented using a DI scheme, such as a data inversion-direct current scheme, in order to limit power consumption associated with the communications link 300. DI may limit power consumption by reducing the probability of either "ones" or "zeros" appearing in transmitted data. In the communications link 300, an encoder 304 may be configured to monitor n-bit parallel input data 302a-302n. The encoder 304 may invert the input data 302a-302n prior to transmittal when more than half of the data bits 302a-302n have an undesired value. The undesired value may be a value that causes greater current flow than other values. For example, the undesired value in each data bit 302a-302n may be a logic '0' if the logic '0' causes current to flow and logic '1' does not cause current flow. The undesired value in each data bit 302a-302n may be a logic '1' in the bit if the logic '1' causes current to flow and logic '0' does not cause current flow. In certain examples described herein, logic '1' will be assumed to cause current flow and logic '0' causes less or no current flow.

An encoding indicator 314, which may also be referred to as an inversion flag or DI signal, may be transmitted to the decoder 312 using a line driver 308 to drive one connector of the physical bus 310. The encoding indicator 314 may indicate when parallel data transmitted through line drivers 306a-306n and the bus 310 to the decoder 312 includes one or more data elements that have been inverted by the encoder 304. The decoder 312 may respond to the encoding indicator by re-inverting any inverted data elements received from the bus 310. In one example, the encoding indicator 314 may be associated with transmission data 302a-302n that has an 8-bit width (i.e. a byte) and the encoding indicator 314 is set if at least 5 bits of the 8-bit transmission data 302a-302n are determined to have the undesired value. The encoder may be configured to invert the transmission data 302a-302n and the decoder 312 may be configured to invert data 316 received from the bus 310 when the encoding indicator 314 is set. The decoder 312 reverses any inversions performed by the encoder 304 and thereby produces an output 318a-318n that is a true copy and/or representation of the input 302a-302n of the encoder 304. In some examples, the determination of whether the encoder 304 should invert the input data 302a-302n may include a consideration of one or more other bytes in a 16, 32 or 64 bit word that are transmitted in parallel with the input 302a-302n of the encoder 304. In some instances, the bus width may be as narrow as two parallel bits or signal lines.

Figure 4:
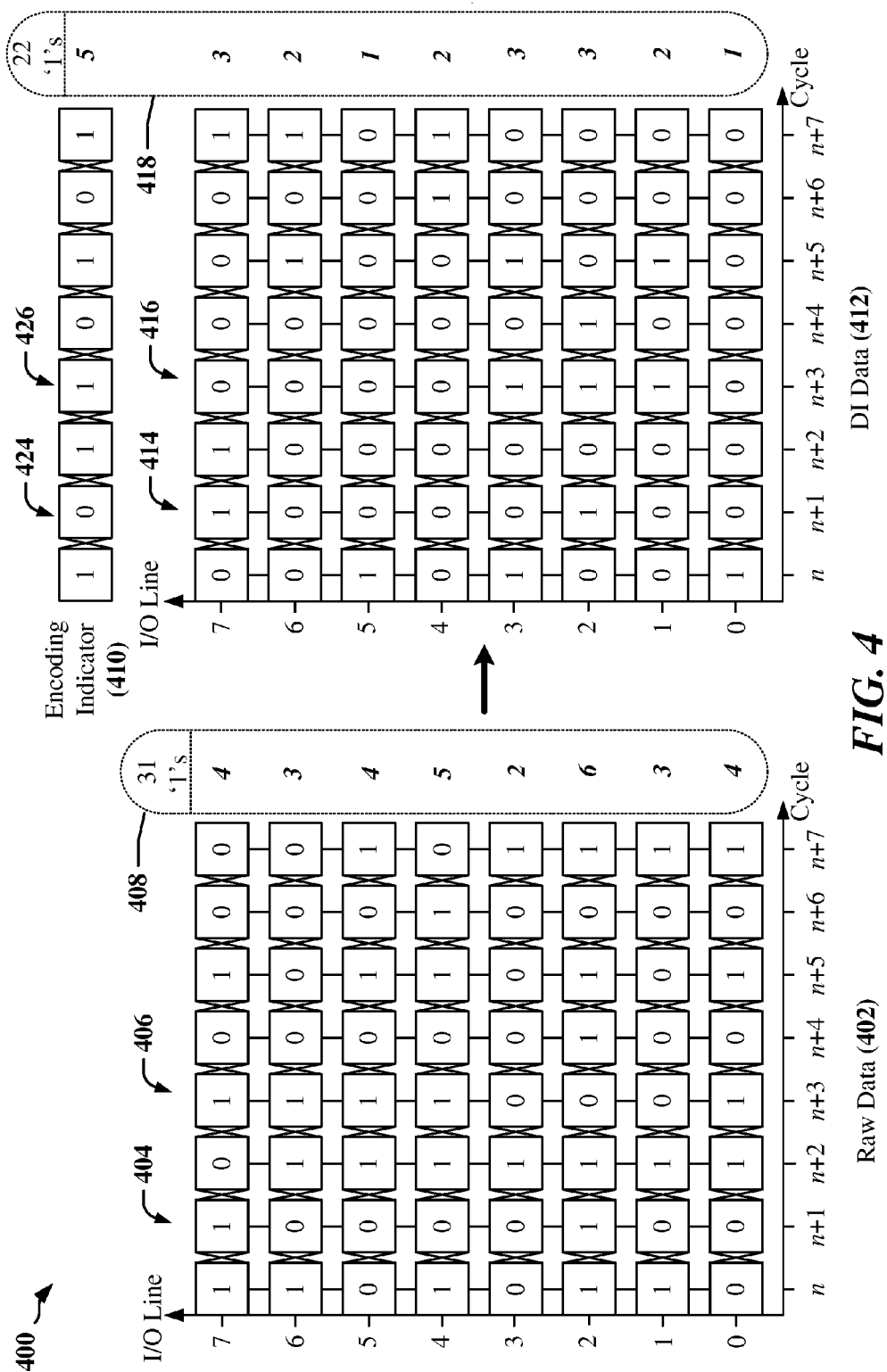
FIG. 4 illustrates timing and encoding in a data inversion encoded communications link according to certain aspects disclosed herein.

FIG. 4 is a timing diagram 400 illustrating certain aspects of the operation of the communications link 300 of FIG. 3. The timing diagram relates to an example in which a sequence of eight bytes transmitted in a sequence of clock cycles, numbered n through n+7 are received by the encoder 304 as raw data 402 for transmission over the communications link 300. Each byte includes eight bits, numbered 0-7 in the timing diagram 400. The encoder 304 may examine each byte to determine if inversion should be performed for that byte. In the example, each logic '1' sent over a data line of the data communications bus 310 is associated with a greater power consumption than each logic '0'. The encoder 304 may invert any byte that includes 5 or more bits set to the logic '1' state. Under this scheme, the second byte 404 in the raw data 402 is transmitted without inversion and the fourth byte 406 is inverted before transmission. As shown in the DI data 412, the second byte 414 in the sequence is unchanged and the fourth byte 416 is inverted after processing by the encoder 304. The inversion status of the DI data 412 is reflected in a DI signal 410 (i.e. the encoding indicator 314) transmitted in parallel with the DI data 412. Thus, the DI signal 410 is at logic '0' in the time slot 424 when the second byte 414 is transmitted and at logic '1' in the time slot 426 when the fourth byte 416 is transmitted.

The effectiveness of the DI encoding scheme may be evaluated by calculating the totals 408 of logic state '1's on the data lines of the bus 310. In the eight bytes of the raw data 402, a total of 31 logic '1' states occur and, after inversion, a total of 17 logic '1' states occur in the DI data 412. However, the savings in power consumption is offset by the total of logic '1' transmitted in the DI signal 410. In the example, 5 logic '1's are transmitted in the DI signal 410 and the reduction in logic state '1's obtained by transmitting DI data 412 is 9 transmitted states, calculated as the difference between the number of logic '1's in the raw data 402 and the combined number of logic '1's in the DI data 412 and the DI signal 410. The reduction in power consumption may have a direct relationship with the number of transmitted logic '1's. In some data encoding schemes, however, certain bits may be associated with greater power levels than other bits and variations of the DI encoding scheme may produce significant power reductions with limited increases in hardware complexity.

Figure 5:
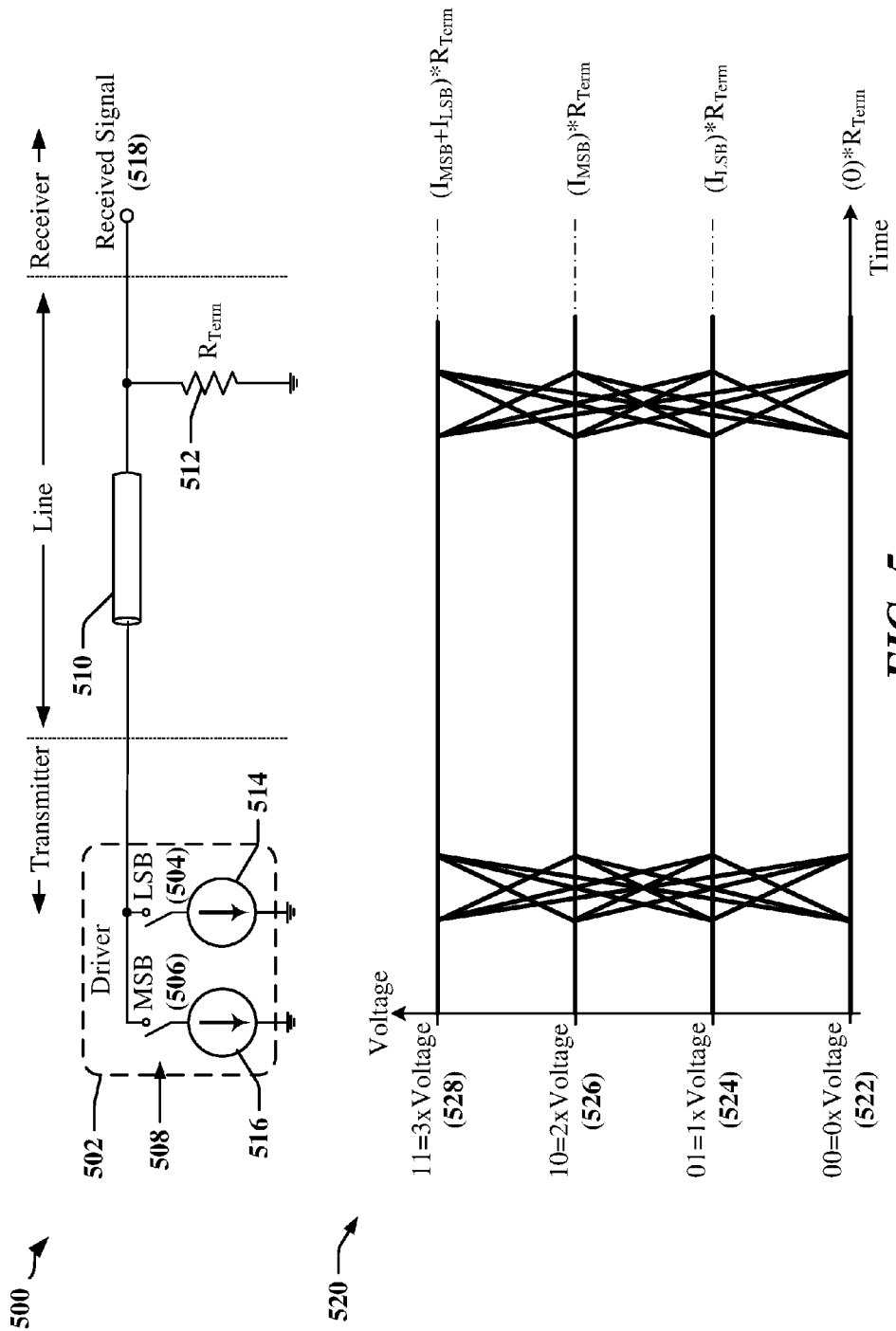
FIG. 5 illustrates a model circuit for a multi-level line driver.

According to certain aspects disclosed herein, a modified DI encoding scheme may be employed with multi-level data encoding. FIG. 5 includes a diagram illustrating a model circuit 500 for a multi-level line driver circuit 502, and also includes a graph 520 illustrating four voltage states 522, 524, 526 and 528 available for encoding data in one corresponding multi-level data encoding scheme. A transmitter-side line driver circuit 502 may be adapted to drive a transmission line 510 in a terminated, multi-level 4-PAM communications link. The driver circuit 502 may be controlled by an encoder (e.g. encoder 304 of FIG. 3) to produce each of four voltage states 522, 524, 526 and 528 through the configuration of a pair of switches 508.

Data may be encoded in two bits, each bit controlling the state of one of the two switches 504, 506. In one example, each switch 504, 506 may be in an open state when its control bit is set to logic '1' and in a closed state when its control bit is set to logic '0'. In another example, each switch 504, 506 may be in a closed state when its control bit is set to logic '1' and in an open state when its control bit is set to logic '0'. In the closed state, each switch 504, 506 enables current from an associated current source 514, 516 to flow through the transmission line 510 and termination resistance 512. A first current source 514 produces less current than a second current source 516. One switch 506 may be controlled by the primary bit because it causes a greater current level to flow (from the second current source 516) through the transmission line 510 when closed than the current level caused when the other secondary bit switch 504 is closed. Current flow in the transmission line 510 and termination resistance 512 determines the voltage level of the received signal 518 at a receiver.

In the example depicted, the first current source 514 may source or sink a unit of current when connected to a load impedance while the second current source 516 sources or sinks two units of current when connected to the load impedance. The amperage corresponding to the unit of current may be determined by the application. The switches 508 may select between four current levels, including 0 units, 1 unit, 2 units and 3 units. For the purposes of this description, the first current source 514 may be used to encode a secondary bit of a multi-bit data symbol, while the second current source 516 may used to encode the primary bit of the multi-bit data symbol. In some instances, the voltage differences or current levels in a multi-state signal may not be uniform. In other words, the current sources may not be binary weighted or exact multiples of one another.

The load impedance may include the combined resistance of the transmission line 510 and the terminating resistor 512, where the terminating resistor 512 may include a resistor connected at the receiving end of a wire that may conduct current provided by the first current source 514 and the second current source 516. The voltage ($V_{out}$) of an output signal 518 at the receiver may be determined as the product of the current ($I_{state}$) flowing in the terminating resistor 512 and the resistance ($R_{term}$) of the terminating resistor 512.

It will be appreciated that, in a 4-PAM configuration, a communications link consumes different amounts of power at each signal level 522, 524, 526 and 528. In a simple case where the terminating resistor 512 dissipates all or substantially all of the power consumed by the driver circuit 502, the power for each state may be calculated as $(I_{state})_2 \times (R_{term})$. Nominally, no power is consumed for zero-state 2-bit data symbols and power consumed by the communications link increases with current flow because the currents associated with the primary bit and the secondary bit of the 2-bit data symbol are summed across the terminating resistor 512 to produce the appropriate signal level. Accordingly, significantly greater power reductions may be obtained from inverting the primary bit of the 2-bit data symbol than the secondary bit of the 2-bit data symbol.

Figure 6:
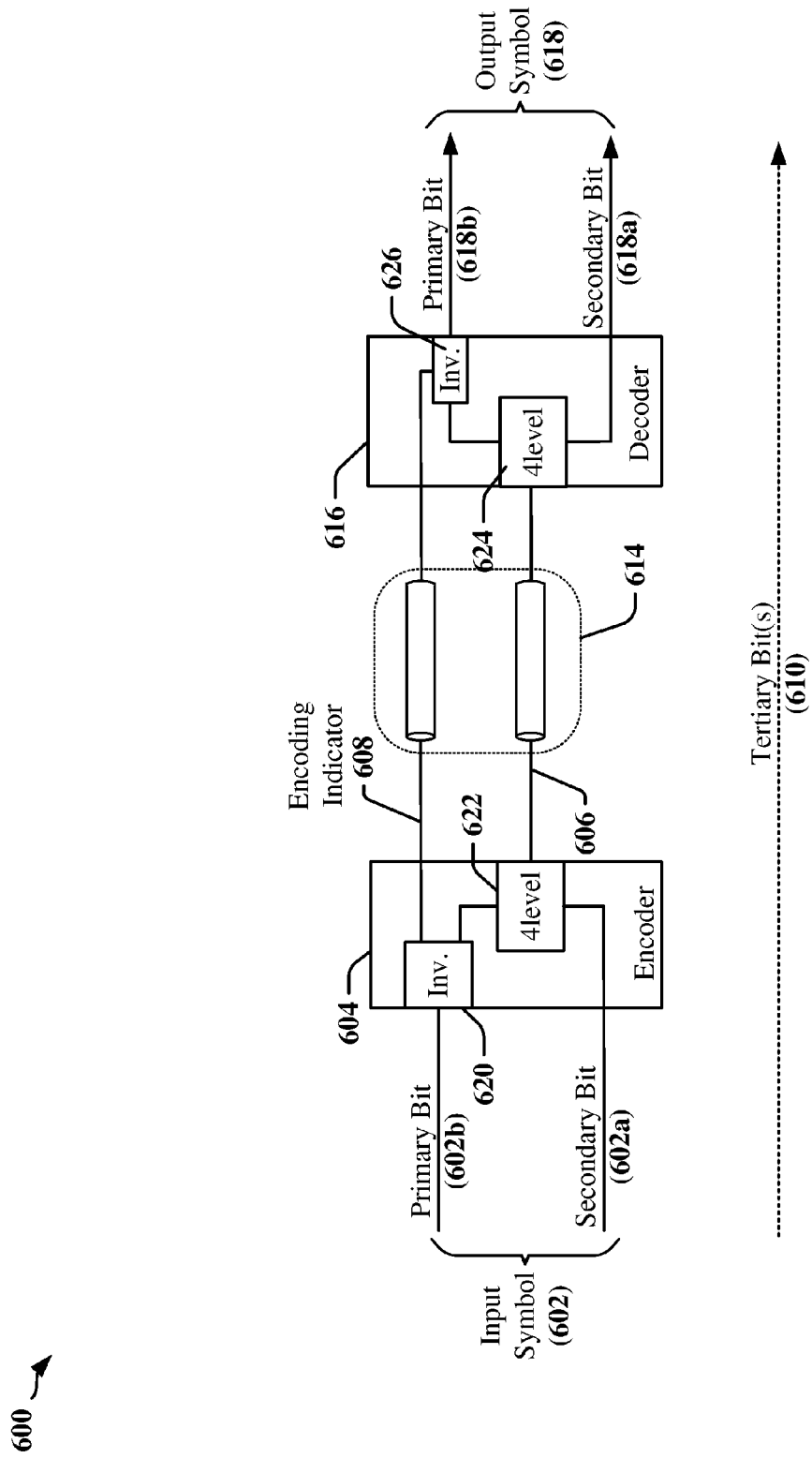
FIG. 6 illustrates a first simplified example of an encoder and decoder configured to implement data inversion according to certain aspects disclosed herein.

FIG. 6 is a block schematic drawing 600 illustrating a simplified example of a 4-PAM encoder 604 configured to implement DI. The encoder 604 receives a 2-bit symbol 602 that has a secondary bit 602a and a primary bit 602b and transmits a four-level output signal 606 through one connector of a parallel bus 614 to a receiver. The receiver may include a 4-PAM decoder that receives and decodes the output 606 of the encoder 604 to produce a multi-bit symbol 618 as an output.

The encoder 604 may be configured to implement a modified DI scheme in which fewer than all of the inputs are subject to inversion. In the simplified example of FIG. 6, a pair of bits including the secondary bit 602a and the primary bit 602b is received in the data symbol 602, but only the primary bit 602b is considered for inversion. Receiving logic 620 determines the state of the primary bit 602b and determines whether the primary bit 602b should be inverted for transmission. If the primary bit 602b is inverted, then an encoding indicator 608 is set and transmitted to the receiver, typically as a separate signal. In some examples, the inversion logic 620 may consider the state of both bits 602a and 602b in the input symbol 602 when determining whether the primary bit 602b is to be inverted. In a simple example, the primary bit 602b inversion occurs when the primary bit 602b is in the logic '1' state, regardless of the state of one or more less significant bits. In some instances, power consumption may be reduced and circuits simplified because the encoding indicator 608 can be transmitted as a 2-level signal. In another example, the state of two or more bits may be considered, including when the input symbol 602 comprises more than two bits or when a plurality of symbols is transmitted. A 4-PAM communications link presents a relatively simple example of the presently disclosed DI technique. However, the principles illustrated in FIG. 6 can be applied to more complex coding schemes, including schemes that apply DI to both the primary bit 602b and the secondary bit 602a in 4-PAM 2-bit data symbols, to one or more bits in 8-PAM 3-bit data-symbols and other higher-state encoding schemes, and for multi-wire 4-PAM or 8-PAM systems.

Figure 7:
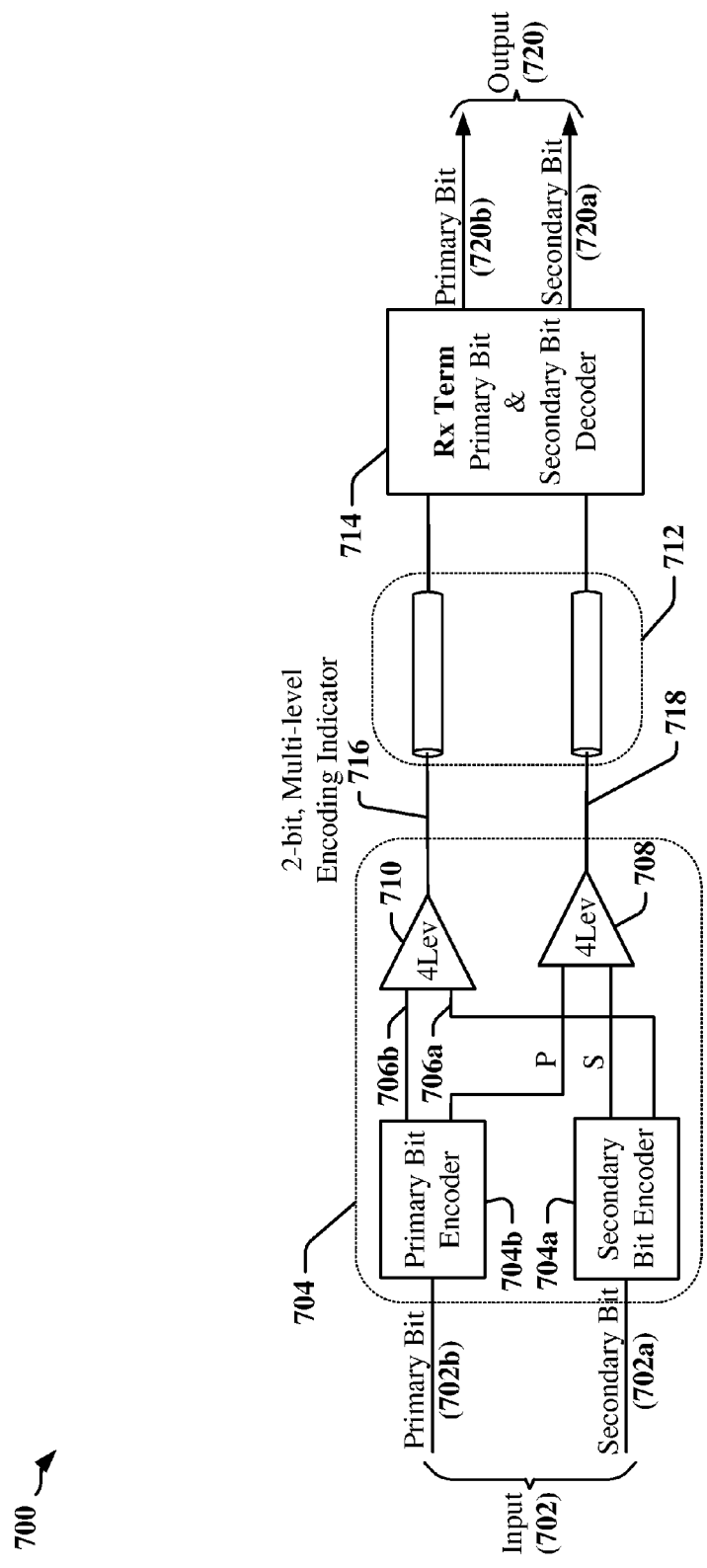
FIG. 7 illustrates a second simplified example of an encoder and decoder configured to implement data inversion according to certain aspects disclosed herein.

FIG. 7 is a block schematic drawing illustrating an example of a communications system 700 implemented using a modified DI encoding scheme. An encoder 704 is configured to encode a 2-bit input symbol 702 in a 4-PAM multilevel signal 718 using a first 4-level encoder/line driver 708. DI may be implemented on one or both of the primary bit 702b and the secondary bit 702a of the input symbol. A primary DI encoding circuit 704b may handle the primary bit 702b of the input symbol 702, while a secondary DI encoding circuit 704a is configured to handle the secondary bit 702a of the input symbol 702. The DI encoding circuits 704a and 704b produce a pair of encoding indicators 706a and 706b, which may be referred to as a 2-bit encoding indicator. The encoding indicators 706a and 706b are provided to a second 4-level encoder/line driver 710 that produces a multi-level encoding indicator signal 716 that is representative of the pair of encoding indicators 706a and 706b. The second 4-level encoder/line driver 710 may be of the same type of driver as the first 4-level encoder/line driver 708.

Figure 8:
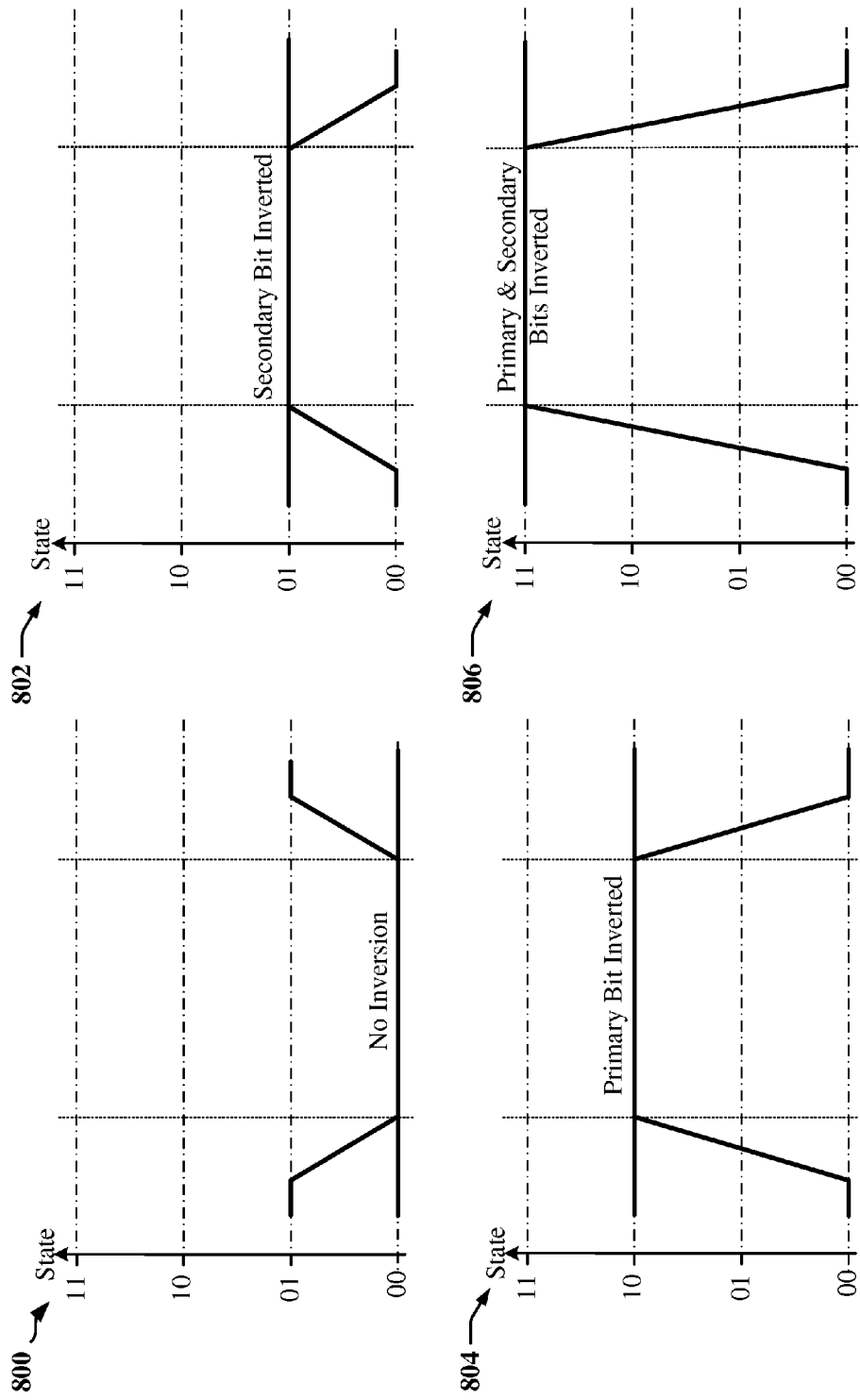
FIG. 8 is a state diagram illustrating multi-level encoding of an encoding indicator signal when a data inversion scheme is used.

The multi-level encoding indicator signal 716 may encode the secondary bit encoding indicator 706a and the primary bit encoding indicator 706b in four voltage states 800, 802, 804 and 806, as illustrated in FIG. 8. In one example, the secondary encoding indicator 706a is provided as the secondary bit of a symbol encoded by the 4-state encoder/line driver 710, and the primary encoding indicator 706b is provided as the primary bit of the symbol encoded by the 4-state encoder/line driver 710. In this example, the transmitted encoding indicator signal 716 may be in a '00' state when no bits are inverted, in a '01' state 802 when only the secondary bit 702a of the input symbol 702 is inverted, in the '10' state 804 when only the primary bit 702b of the input symbol 702 is inverted and in the '11' state 806 when both the primary bit 702b and the secondary bit 702a of the input symbol 702 are inverted.

Other encoding indicator encoding schemes may be used based on the type of data transmitted and/or characteristics of the data that may affect the frequency of occurrence of '1's or '0's in the secondary bit 702a and primary bit 702b of the input symbol 702.

The average power consumption of an 8-bit parallel bus can be reduced by over 21.1% for a 4-PAM signal when DI is applied to the primary bit. When DI is used with both the primary bit and the secondary bit in 2-bit data symbols, reduction in power consumption for the 8-bit parallel bus can be reduced by more than 29.1%. In some configurations, a simple binary data encoding indicator may be employed for a primary bit inversion. In some instances, a trade-off is applied to balance the increased power consumption that may be experienced by a receiver when multi-level signaling is used. For example, the receiver power consumption may increase by a factor of 50% in a 4-PAM topology, although the receiver consumes only a small fraction of the overall signaling power.

Figure 9:
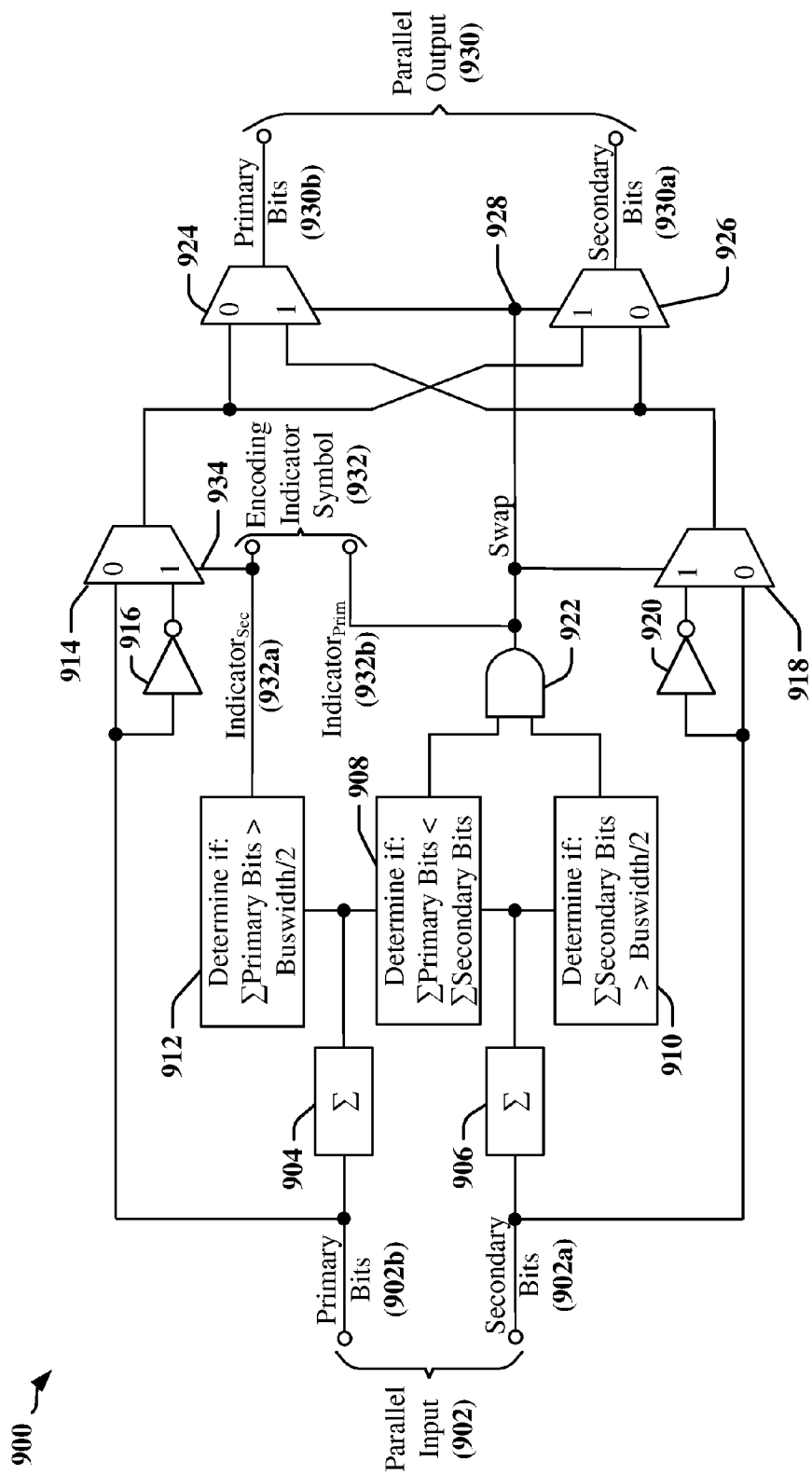
FIG. 9 illustrates an example of an encoder configured to perform a combination of data inversion and bit swapping.

According to certain aspects disclosed herein, signaling power associated with a communications link may be further reduced by selectively swapping primary bit and secondary bit bits during encoding. FIG. 9 illustrates an example in which modules and/or circuits 900 are configured to perform a combination of data inversion and bit swapping (DI+BS) according to a process illustrated in the flowchart 1000 of FIG. 10, in one example, a bus having a width W is configured to carry data encoded using 4-PAM. The data is provided as a set of multi-bit input symbols 902 to be transmitted in a single transmit clock cycle. The allocation of bus bits to the set of symbols may be selected according to application and/or characteristics of the data to be transmitted. In one example, allocation is made sequentially, such that a first symbol includes the two least significant bits of the bus, a second symbol includes the next two least significant bits, and so on.

The number of logic '1's in the primary bits 902b to be transmitted for each set of symbols are summed 1002 using a first summing circuit or module 904. The number of logic '1's in the secondary bits 902a to be transmitted for each set of symbols are summed 1004 using a second summing circuit or module 906. The circuit 900 may include a first logic or mathematical comparator 908 that compares 1006 the output of the first summing circuit of module 904, which may represent the number of primary bits 902b set to logic '1', with the output of the second summing circuit or module 906, which may represent the number of secondary bits 902a set to logic '1'.

If the output of the first comparator 908 indicates that the sum of the logic '1' primary bits 902b exceeds the sum of logic '1' secondary bits 902a, or it is determined 1008 by a second comparator module or circuit 910 that the fraction of secondary bits 902a in the logic '1' state is not greater than a half (i.e the sum of logic '1' secondary bits 902a is not greater than half the bus width (W/2)), then the DI encoding process is performed 1020 without swapping primary bits 902b and secondary bits 902a.

If the output of first comparator 908 indicates that the sum of the logic '1' primary bits 902b is less than the sum of logic '1' secondary bits 902a and the fraction of secondary bits 902a in the logic '1' state is greater than a half, then the input secondary bits 902a are inverted 1010 and provided as output primary bits 930b, while the while the input primary bits 902b are provided as output secondary bits 930a, with a primary bit 932b of the encoding indication symbol (EISym) 932 encoded as an encoding indicator signal being set to logic '1' to indicate that a swap has occurred. In one example, this swap is effected using multiplexers 924, 926 that are controlled by a logic gate 922 that combines the results of the first comparator 908 and the second comparator 910 to obtain a swap signal 928, which also serves as the primary bit 932b of the EISym 932. Selective inversion of the input secondary bits 902a may be implemented using multiplexers 918 that are controlled by the swap signal 928, which selects between the input secondary bits 902a and an inverted version of the input secondary bits 902a provided by inverters 920.

When the output primary bits 930b correspond to inverted input secondary bits 902a (i.e. when a swap is indicated), a determination 1012 of whether to invert the input primary bits 902b may be based on the number of input primary bits 902b that are set to logic '1' as indicated by the output of a third comparator circuit or module 912. If the fraction of input primary bits 902b is greater than a half, then the input primary bits 902b are inverted 1010 and provided as output secondary bits 930a and the secondary bit 932a of the EISym 932 is set. If the fraction of input primary bits 902b is not greater than a half, then the input primary bits 902b are provided 1018 without inversion as output secondary bits 930a and the output secondary bit 932a of the EISym 932 is cleared. In one example, selective inversion of the input primary bits 902b may be implemented using multiplexers 914 that receive the input primary bits 302b and an inverted version of the input primary bits 902b provided by inverters 916.

When DI encoding is performed 1020 without swapping primary bits 902b and secondary bits 902a, the primary bit 932b of the EISym 932 is cleared 1022, and the input secondary bits 902a a are provided as output secondary bits 930a without inversion. The inversion state of the input primary bits 902b may be determined 1024 based on the number of input primary bits 902b that are set to logic '1' as indicated by the output of a third comparator circuit or module 912. If the fraction of input primary bits 902b is greater than a half, then the input primary bits 902b are inverted 1028 and provided as output primary bits 930b and the secondary bit of 932a of the EISym 932 is set. If the number of input primary bits 902b is not greater than half the bus width, then the input primary bits 902b are provided 1026 without inversion as output primary bits 930b and the secondary bit of 932a of the EISym 932 is cleared.

Figure 11:
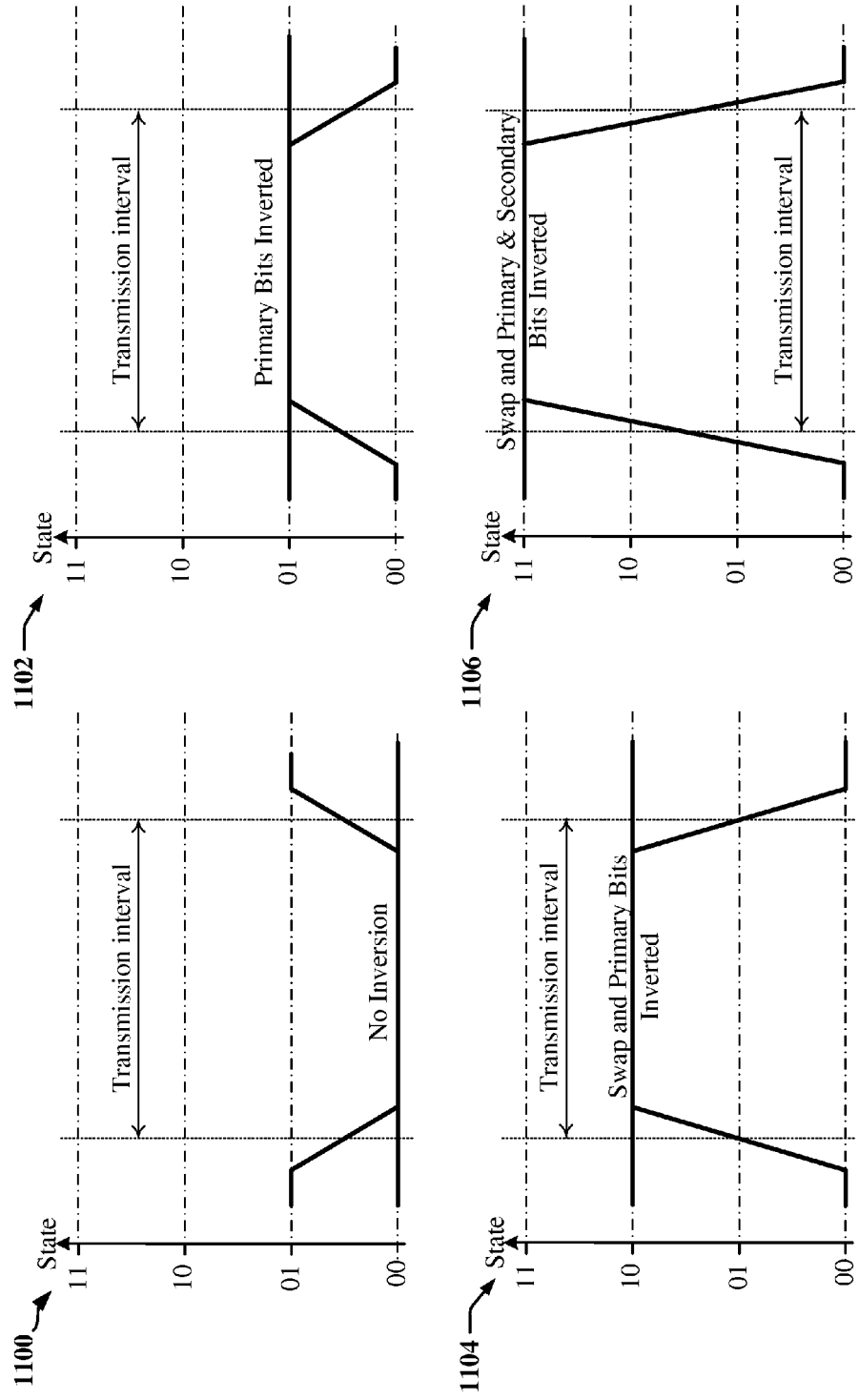
FIG. 11 is a state diagram illustrating multi-level encoding of an encoding indicator signal when a data inversion and bit swapping scheme is used.

The encoding indicator signal 932 provides information that indicates to a receiver whether the primary bits 902b and the secondary bits 902a should be swapped and whether the secondary bits should be inverted. In certain DI+BS algorithms, the primary bits 902b and the secondary bits 902a are swapped when more secondary bits 902a are in a higher power state than primary bits 902b and when the fraction of secondary bits 902a in the higher power state is greater than a half. Accordingly, the secondary bits 902a are necessarily inverted if a swap occurs when these DI+BS algorithms are used. FIG. 11 illustrates an example of a multi-level encoding scheme that may be used to encode an encoding indicator signal when a DI+BS algorithm is used. In this example, a swap control signal 928 is used as the primary bit 932b of the EISym 932 and a control signal 934, which is used to select between primary bits 902b and a version of the primary bits 902b produced by inverting logic 916, is provided as the secondary bit 932b of the EISym 932. The encoding indicator signal derived from the EISym 932 may switch between four states 1100, 1102, 1104 or 1106 during each transmission interval, where the transmission interval may correspond to a transmission clock cycle or edge.

According to the multi-level encoding scheme illustrated in FIG. 11, the encoding indicator signal is in a '00' state when no bits are inverted or swapped, and in the '01' state when the primary bits 902b have been inverted without swapping. When the primary bits 902b and the secondary bits 902a are swapped, the encoding indicator signal is either in a '10' state when the primary bits 902b are not inverted, or in the '11' state when the primary bits 902b have been inverted. When the encoding indicator signal is in the '10' state or the '11' state, it can be inferred that the secondary bits 902a have been inverted.

A DI+BS encoding circuit, such as the circuit 900 shown in FIG. 9 may be configured or adapted to support other encoding schemes, including certain encoding schemes described herein. For example, DI may be applied to both the primary bits and the secondary bits of a multi-bit symbol without swapping by removing or disabling the primary-to-secondary bits compare element 908, or by forcing an output of the compare element 908 to cause the output multiplexers 924 and 926 to select a non-swapped output configuration. In one example, the AND gate 922 may be enabled to provide the output of the secondary bit comparison/bus-width comparison 910 for combination in the encoding indicator signal. In this reduced form, the output of comparator 910 may control the multiplexer 918 and provide the encoding indicator for the secondary bit path, and the primary bit output 930b and secondary bit output 930a may then be representative of the output of the multiplexers 914 and 918, respectively. While certain logic, gates and devices may be physically eliminated, alternative encoding schemes can be achieved by disabling logic gates and devices using control signals provided by a processing device or a data encoding controller. In another example, the DI scheme may be limited to the primary bits, with the secondary bits being passed directly to the multi-state encoder.

Figure 10:
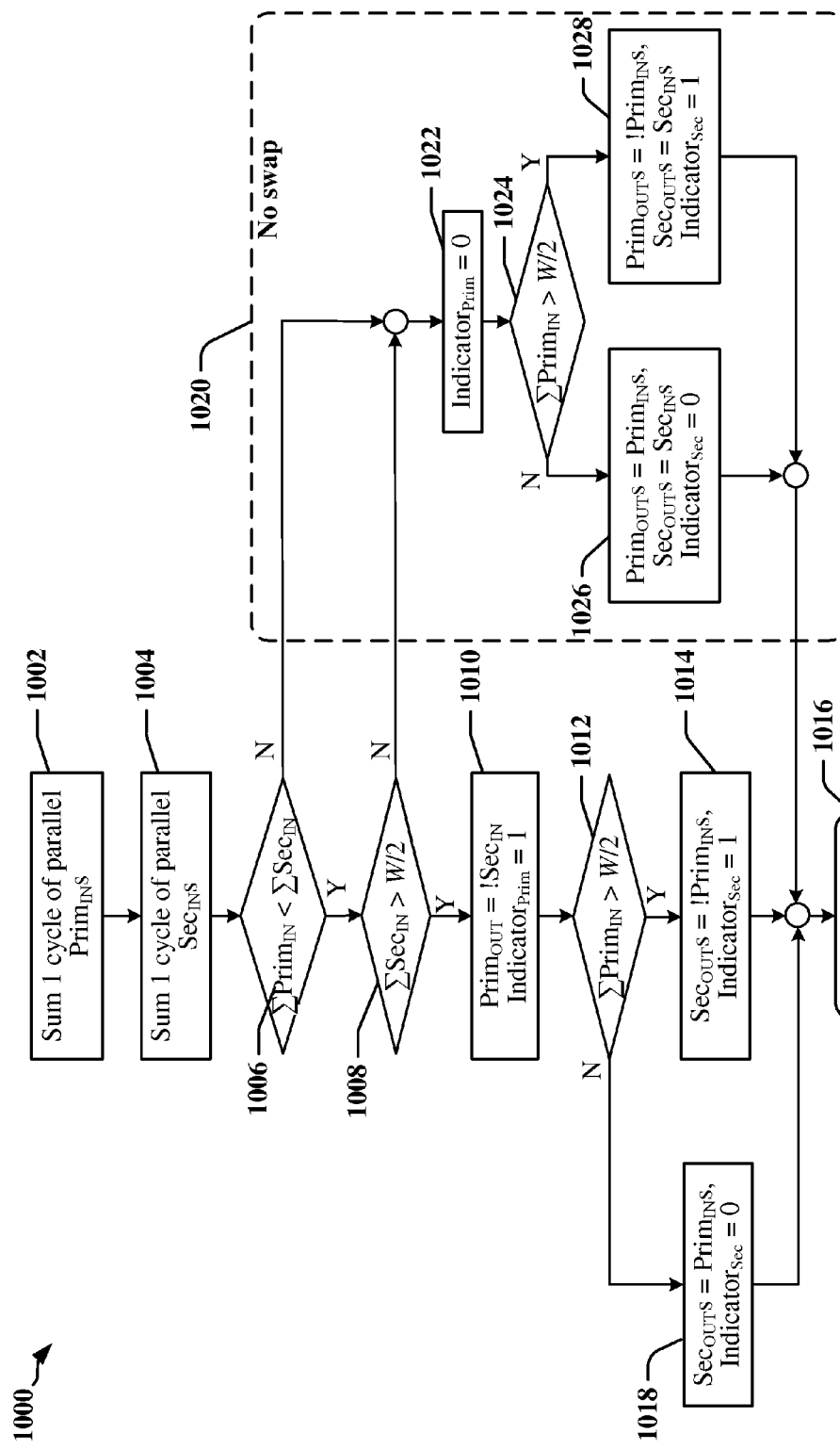
FIG. 10 is a flowchart illustrating multi-level data inversion encoding with bit swapping.
Figure 12:
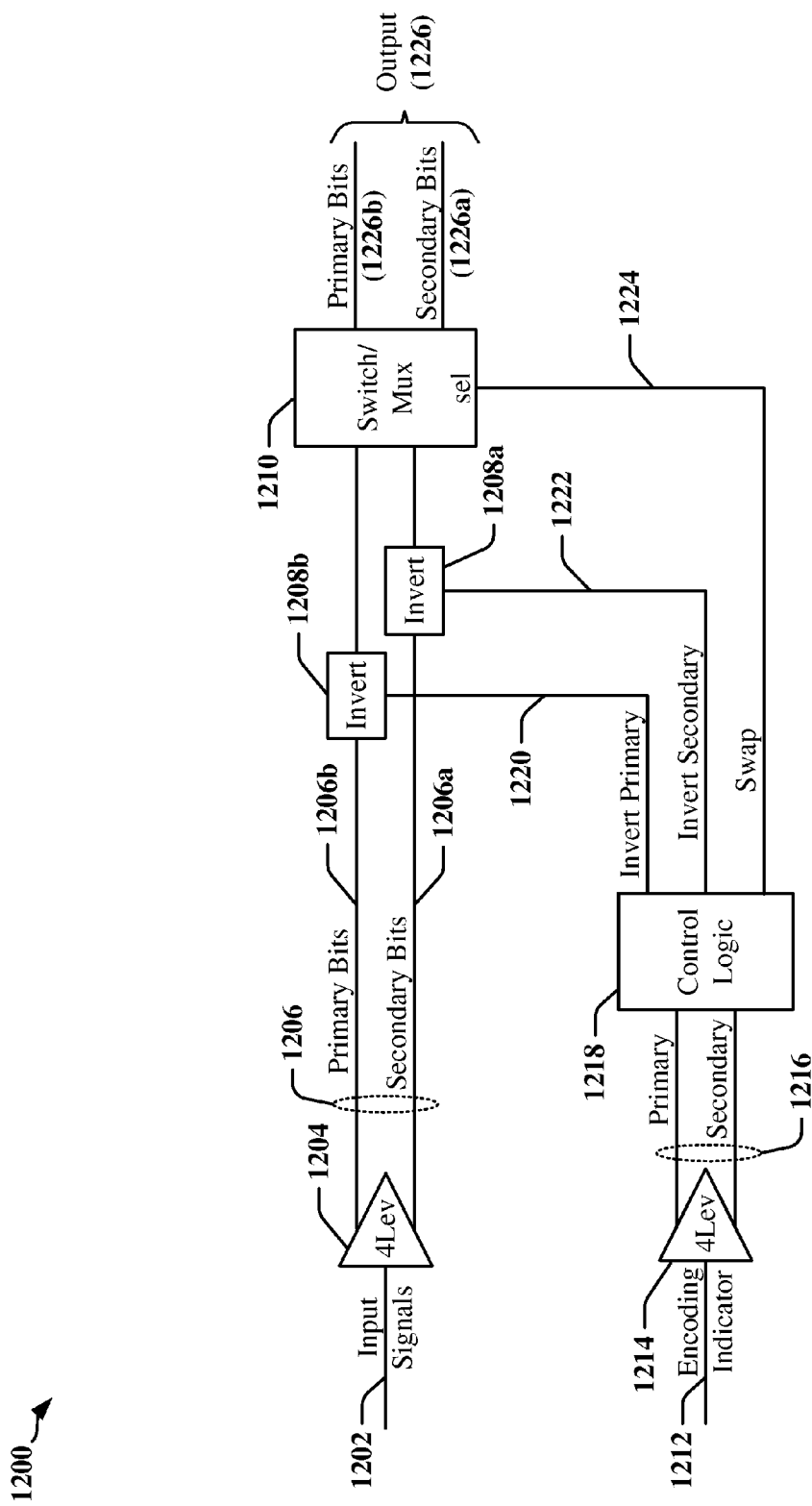
FIG. 12 illustrates an example of a decoder configured to receive multi-level data inversion encoded signals with bit swapping.

FIG. 12 illustrates a simplified decoder 1200 that may include one or more modules and/or circuits configured to receive and decode 4-PAM signals generated using a DI+BS encoding scheme according to the process illustrated in the flowchart 1000 of FIG. 10. Input signals 1202 received from a bus by corresponding 4-PAM decoders 1204 may be decoded into a set of multi-bit symbols 1206 that may be further processed. Additional processing is controlled by a 4-PAM encoding indicator signal 1212 that is decoded by a 4-PAM encoding indicator decoder 1214. The 4-PAM encoding indicator decoder 1214 extracts a 2-bit symbol encoding indicator 1216 that has a primary bit and a secondary bit, for which the states are defined by the algorithm described in the flowchart 1000 of FIG. 10.

Control logic 1218 may be configured to provide control signals 1220, 1222 and 1224 that determine whether the secondary bits 1206a and primary bits 1206b of the data are inverted and/or swapped before being provided as the output symbols 1226. The control logic 1218 may provide the control signals 1220, 1222 and 1224 in accordance with the operations defined by Table 1, which lists the operations to be performed for each possible value of encoding indicator 1216.

TABLE 1

| Primary Bit | Secondary Bit | Level | Operation(s) |
|---|---|---|---|
| 1 | 1 | 3 | Invert both bits 1206a, 1206b and swap |
| 1 | 0 | 2 | Invert primary bits 1206b and swap |
| 0 | 1 | 1 | Invert primary bits 1206b |
| 0 | 0 | 0 | No operation |

In one example, the control logic 1218 may provide a primary bit inversion control signal 1220 that controls primary bit inversion logic 1208b which inverts the received primary bits 1206b, a secondary bit inversion control signal 1222 that controls secondary bit inversion logic 1208a which inverts the received secondary bits 1206a, and a swap control signal 1224 that causes a switching matrix or multiplexers 1210 to select between the outputs of the secondary bit inversion logic 1208a and the primary bit inversion logic 1208b to serve as the secondary bit 1226a and the primary bit 1226b of the output symbols 1226. The control logic 1218 may be provided as combinational logic that may be field programmable to permit use of other DI or DI+DS encoding schemes.

Figure 13:
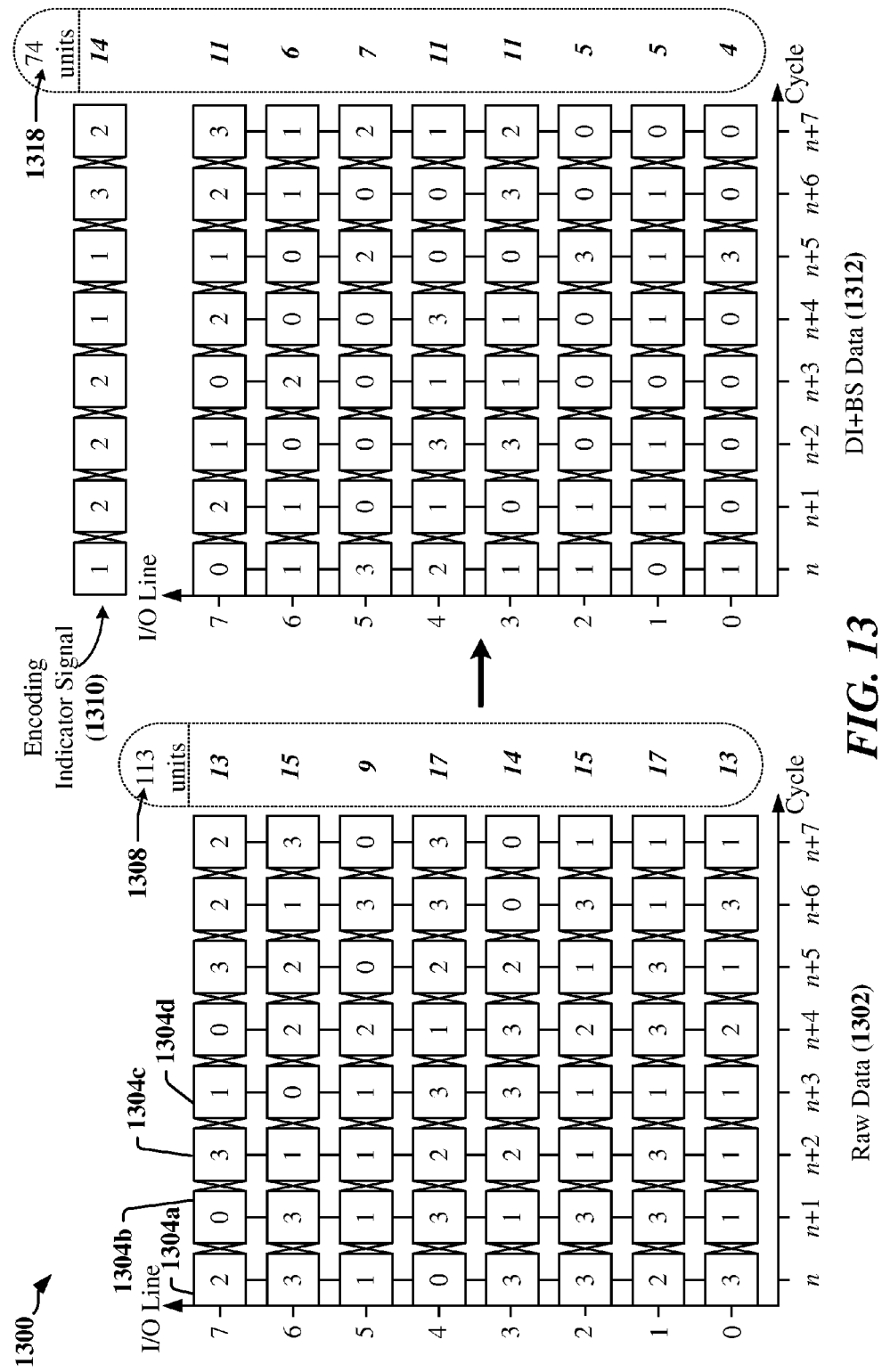
FIG. 13 illustrates timing and encoding in a data inversion encoded communications link according to certain aspects disclosed herein.

FIG. 13 is a diagram 1300 illustrating certain benefits that may be accrued from the use of DI+BS encoding. A sequence of raw data 1302 to be encoded for transmission over an 8-wire bus is provided to logic such as the DI+BS circuitry 900 illustrated in FIG. 9. Each clock cycle is depicted as an encoding level on a corresponding transmission line, expressed as a number of units of current or voltage associated with the raw data 1302. For the purposes of this description, a two-bit encoding scheme is assumed, whereby a primary bit is the MSB and is encoded as a binary multiplier of 2 units of current or voltage and a secondary bit is the LSB and is encoded as a binary multiplier of 1 unit of current or voltage. Accordingly, a two-bit raw symbol may have values 00, 01, 10 or 11 that are encoded as 0, 1, 2 or 3 units of voltage or current respectively. Thus, for example, a portion of the sequence of raw data 1302 may include a sequence of states 1304a-1304d transmitted in a sequence of clock cycles on one wire of a parallel bus. As illustrated, the sequence of states 1304a-1304d may reflect encoding states of 2 units, 0 units, 3 units and 1 unit of current or voltage, respectively. Power associated with the raw data 1302 may be represented by the total number of units of current or voltage 1318 used to transmit the data over the 8-wire bus. In some examples, the square of the sum of the levels is directly proportional to the signaling power. For the raw data, the total number of units of current or voltage 1308 expended is 113 units.

Figure 14:
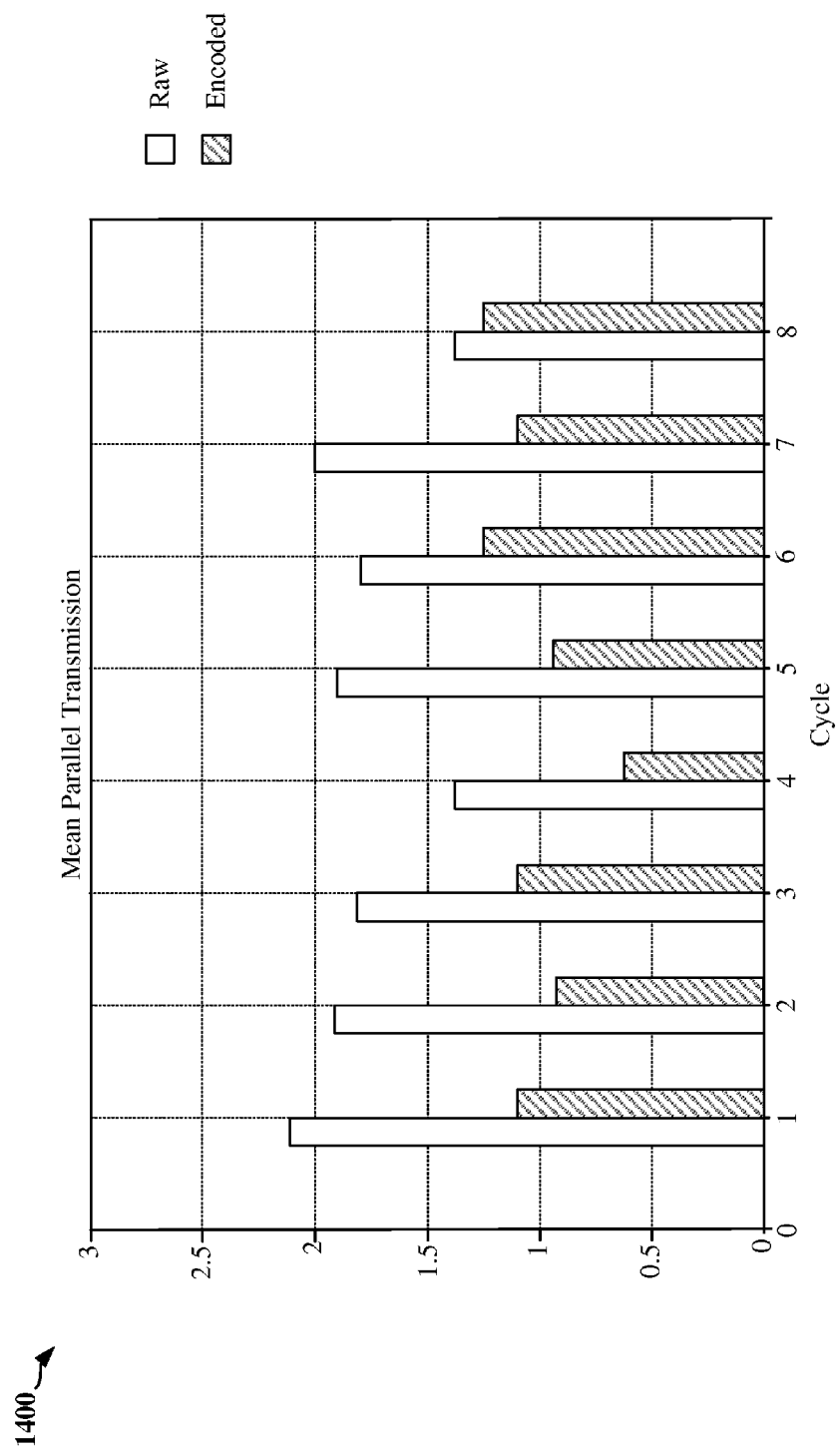
FIG. 14 is a graph illustrating current consumption reductions obtained using certain encoding schemes disclosed herein.

The sequence of raw encoded data 1302 may be processed by the DI+BS circuitry 900 to produce DI+BS data 1312 according to certain aspects described herein. The DI+BS data 1312 may then be used to encode corresponding transmission lines. The total number of units of current or voltage 1318 expended for the depicted example is 74 units, including the number of units (14) needed to encode a transmission line carrying an encoding indicator signal 1310. In the depicted example, a 41.2% power reduction is obtained through the use of DI+BS encoding. FIG. 14 is graph 1400 illustrating the mean signal current level transmitted during each cycle for the raw data 1302 and the DI+BS encoded data 1312 described in relation to the example shown in FIG. 13.

Figure 15:
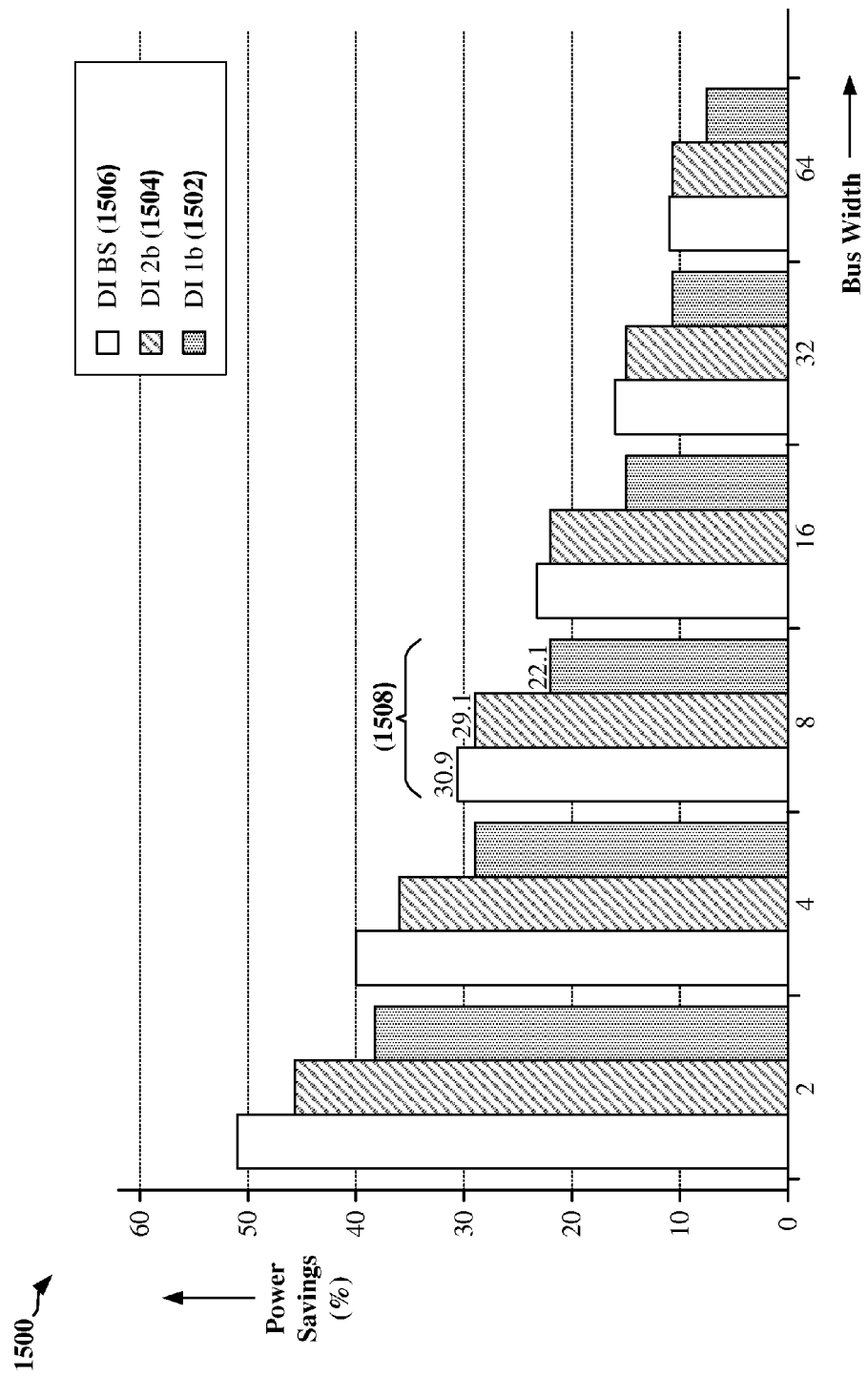
FIG. 15 is a graph illustrating differences in current consumption reductions obtained using different encoding schemes disclosed herein.

FIG. 15 is a graph 1500 illustrating differences in power reductions obtained using different encoding schemes disclosed herein. The graph 1500 indicates reductions in power consumption obtained for a first DI encoding scheme 1502 where only the primary bit is selectively inverted and the encoding indicator is transmitted as a two-level signal, a second DI encoding scheme 1504 where both the primary bit and secondary bit are selectively inverted and the encoding indicator is a multi-bit symbol transmitted in a four-level signal, and a third DI encoding scheme 1506 where both the primary bit and secondary bit are selectively inverted and/or swapped and the inversion/swap flag is a multi-bit symbol transmitted in a four-level signal. The graph 1500 includes bar charts illustrating comparative reductions in power consumption for the three encoding schemes 1502, 1504 and 1506 when the bus has 2, 4, 8, 16, 32 and 64 bit-widths.

For example, the graph 1500 highlights an example (indicated generally at 1508) of percentage power savings for an 8-bit bus. In this example 1508, the DI primary bit encoding scheme 1502 produces a 22.1% power savings, the DI 2-level primary bit and secondary bit inversion encoding scheme 1504 produces an 29.1% power savings, while the primary bit/secondary bit inversion/swap encoding scheme 1506 produces a 30.9% power savings.

The principles illustrated in FIGS. 3-15 can be applied to more complex coding schemes, including schemes that apply DI to multi-bit data symbols where each bit is weighted by current or voltage levels that are multiples of one another, and to more complex encoding indicators representing the data symbol or a combination of data symbols transmitted in a multi-wire communications link. In this description, the terms "primary bit" and "secondary bit" are associated with higher and lower current/power, respectively, although the principles apply also to encoding schemes in which secondary bit signaling consumes more power than primary bit signaling. Certain examples employ primary bits that are MSBs of multi-bit data symbols, although the primary bit may be selected as any bit of a multi-bit data symbols. Furthermore, the concepts, systems, methods and apparatus described herein can be applied to encoding schemes in which logic '1's are associated with lower power than logic '0's, notwithstanding that certain examples described herein are based on an assumption that logic '1's are associated with higher power.

Figure 16:
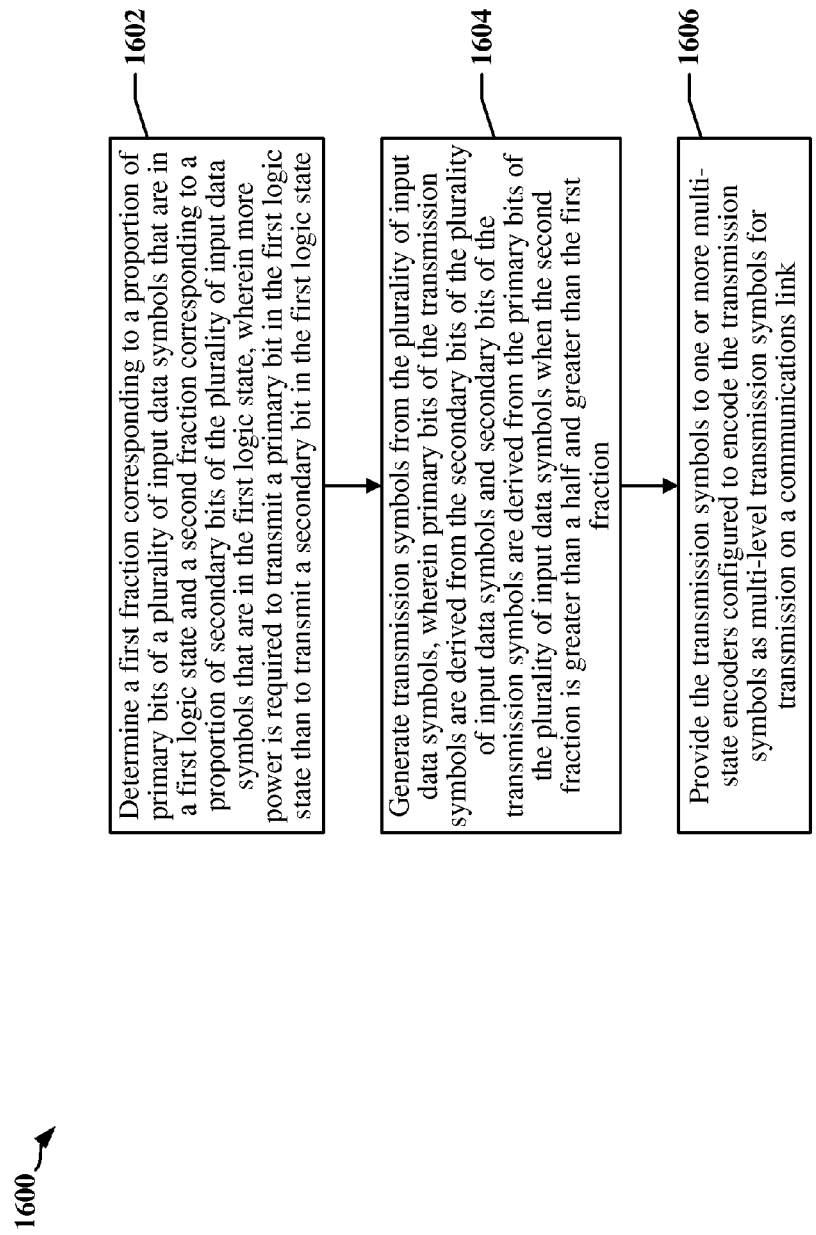
FIG. 16 is a flowchart illustrating a data communication method performed by an encoder according to certain aspects of the invention.

FIG. 16 is a flowchart illustrating a data communication method according to certain aspects of the invention. In one example, the method may be performed by a device that includes a 4-PAM encoder. At step 1602, the device may determine a first fraction corresponding to a proportion of primary bits of a plurality of input data symbols that are in a first logic state and a second fraction corresponding to a proportion of secondary bits of the plurality of input data symbols that are in the first logic state. More power may be required to transmit a primary bit in the first logic state than to transmit a secondary bit in the first logic state. The primary bits and secondary bits may be binary-encoded bits of a multi-bit data symbols. More power may be required to transmit a binary-encoded bit in the first logic state than to transmit a binary-encoded bit in a second logic state.

At step 1604, the device may generate transmission symbols from the plurality of input data symbols. The primary bits of the transmission symbols may be derived from the secondary bits of the plurality of input data symbols when the second fraction is greater than a half and greater than the first fraction. The secondary bits of the transmission symbols may be derived from the primary bits of the plurality of input data symbols when the second fraction is greater than a half and greater than the first fraction. Transmission symbols may be generated from the plurality of input data symbols by inverting the primary bits of the input data symbols when the first fraction is greater than a half. Transmission symbols may be generated from the plurality of input data symbols by inverting the secondary bits of the input data symbols when the second fraction is greater than a half. Transmission symbols may be generated from the plurality of input data symbols by inverting the primary bits of the transmission symbols when the first fraction is greater than a half or the second fraction is greater than a half.

At step 1606, the device may provide the transmission symbols to one or more multi-state encoders configured to encode the transmission symbols as multi-level transmission symbols for transmission on a communications link.

In an aspect of the disclosure, a sequence of the transmission symbols may be transmitted on a connector of the communications link. The transmission symbols may be transmitted in parallel on the communications link.

In an aspect of the disclosure, an encoding indicator signal may be provided to one of the multi-state encoders to obtain a multi-level encoding indicator signal indicating whether the primary bits of the transmission symbols correspond to the secondary bits of the input data symbols and whether the secondary bits of the transmission symbols correspond to the primary bits of the input data symbols.

In an aspect of the disclosure, the multi-level encoding indicator signal and the multi-level transmission symbols may be transmitted in parallel in one transmission clock cycle on the communications link. The multi-level encoding indicator signal may indicate whether the primary bits of the transmission symbols are inverted. The multi-level encoding indicator signal may indicate whether the secondary bits of the transmission symbols are inverted. The one or more multi-state encoders may encode each of the transmission symbols as one of at least three voltage or current levels. The one or more multi-state encoders may encode each of the transmission symbols for transmission on a pulse amplitude modulated communications link.

Figure 17:
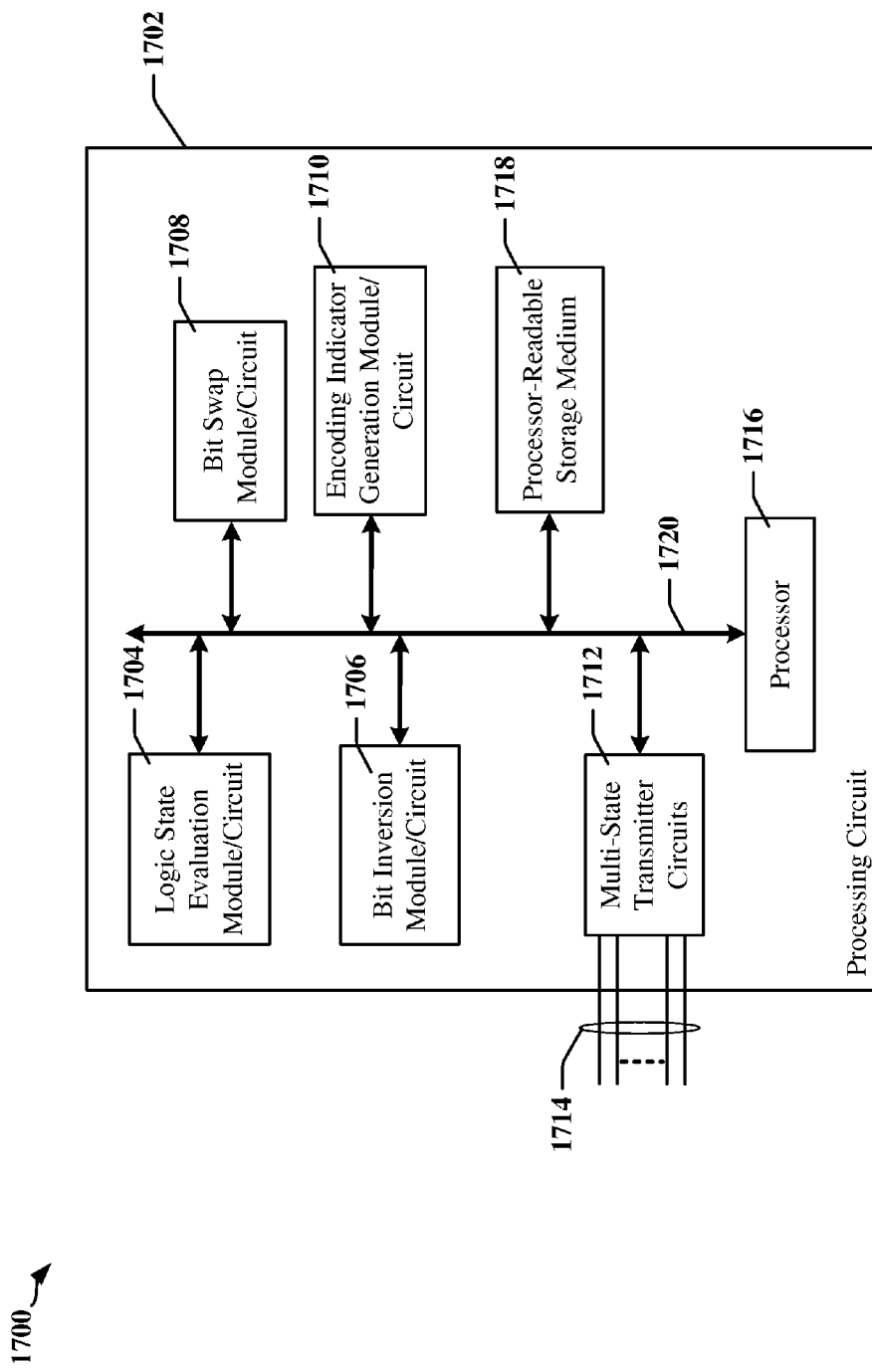
FIG. 17 illustrates an apparatus configured to encode data using a combination of data inversion and bit swapping.

FIG. 17 is a diagram illustrating a simplified example of a hardware implementation for an apparatus 1700 employing a processing circuit 1702. The processing circuit 1702 may be implemented with a bus architecture, represented generally by the bus 1720. The bus 1720 may include any number of interconnecting buses and bridges depending on the specific application of the processing circuit 1702 and the overall design constraints. The bus 1720 links together various circuits including one or more processors and/or hardware modules, represented by the processor 1716, the modules or circuits 1704, 1706, 1708 and 1710, multi-state transmitter circuits 1712 configurable to drive connectors or wires of a communications link 1714 and the computer-readable storage medium 1718. The bus 1720 may also link various other circuits such as timing sources, peripherals, voltage regulators, and power management circuits, which are well known in the art, and therefore, will not be described any further.

The processor 1716 may include a microprocessor, a controller, a digital signal processor, a sequencer, a state machine, etc. The processor 1716 is responsible for general processing, including the execution of software stored on the computer-readable storage medium 1718. The software, when executed by the processor 1716, causes the processing circuit 1702 to perform the various functions described supra for any particular apparatus. The computer-readable storage medium 1718 may also be used for storing data that is manipulated by the processor 1716 when executing software. The processing circuit 1702 further includes at least one of the modules 1704, 1706, 1708 and 1710. The modules 1704, 1706, 1708 and/or 1710 may include one or more software modules running in the processor 1716, resident/stored in the computer-readable storage medium 1718, one or more hardware modules coupled to the processor 1716, or some combination thereof.

In one configuration, the apparatus 1700 for wireless communication includes a module or circuit 1704 for determining a first fraction corresponding to a proportion of primary bits of a plurality of input data symbols that are in a first logic state and a second fraction corresponding to a proportion of secondary bits of the plurality of input data symbols that are in the first logic state, a module or circuit 1706, 1708 for generating transmission symbols from the plurality of input data symbols for transmission on the communications link 1714, a module or circuit 1712 for encoding the transmission symbols for transmission on a multi-state encoded communications link 1714, a module or circuit for generating an inversion encoding indicator as a multi-level transmission symbol to be transmitted on a communications link indicating whether the primary bits and/or secondary bits are inverted and/or swapped. The aforementioned means may be implemented, for example, using some combination of a processor 206 or 236, physical layer drivers 210 or 240 and storage media 208 and 238.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

Figure 18:
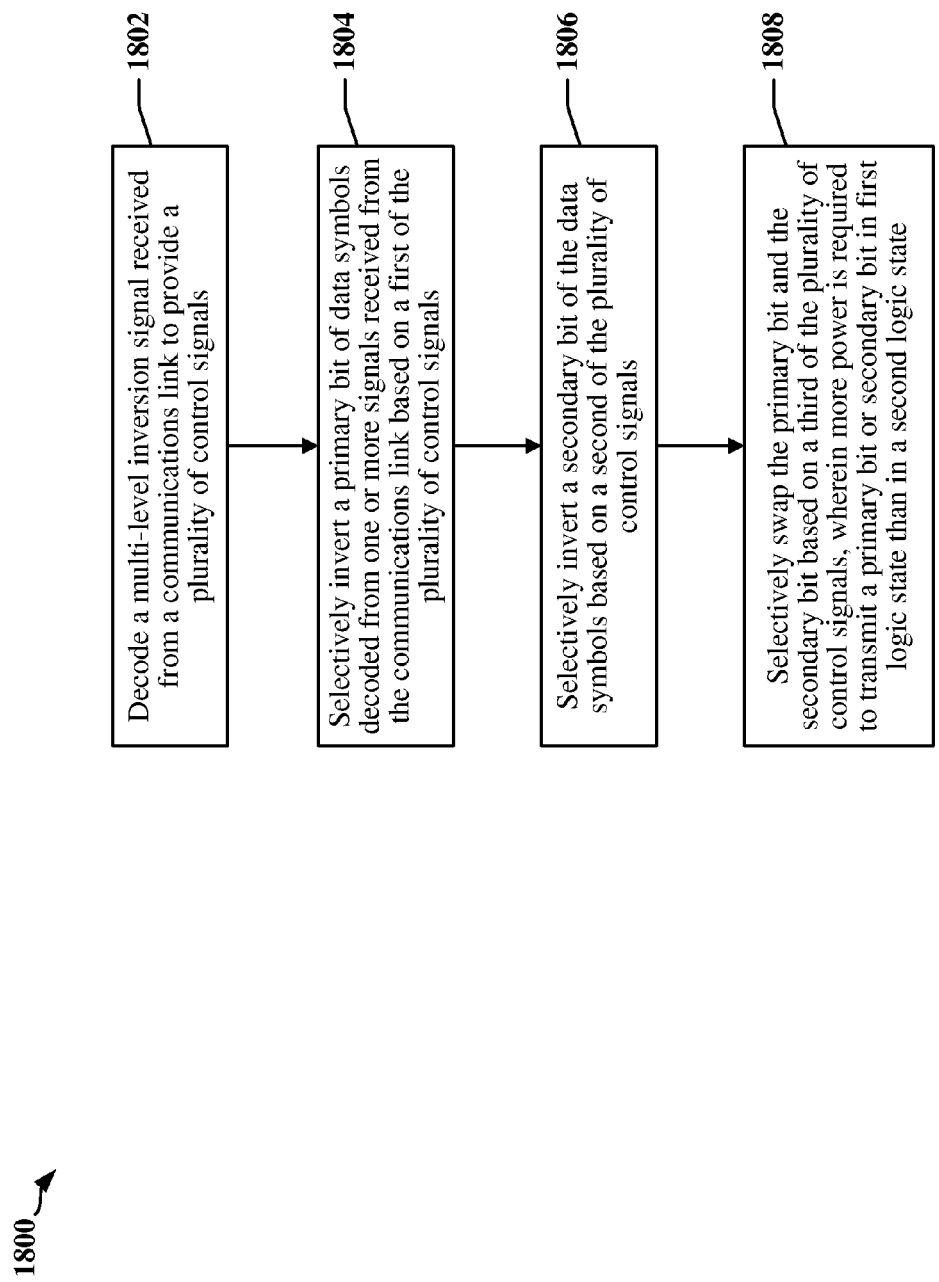
FIG. 18 is a flowchart illustrating a data communication method performed by a data inversion decoder according to certain aspects of the invention.

FIG. 18 is a flowchart illustrating a data communication method according to certain aspects of the invention. In one example, the method may be performed by a device that includes a 4-PAM decoder. At step 1802, the device may decode a multi-level encoding indicator signal received from a communications link to provide a plurality of control signals. The encoding indicator signal received from the communications link may include one or more 4-level PAM signals.

At step 1804, the device may selectively invert a primary bit of data symbols decoded from one or more signals received from the communications link based on a first of the plurality of control signals. The one or more signals may include 4-level PAM signals.

At step 1806, the device may selectively invert a secondary bit of the data symbols based on a second of the plurality of control signals.

At step 1808, the device may selectively swap the primary bit and the secondary bit based on a third of the plurality of control signals. More power may be required to transmit a primary bit or secondary bit in first logic state than in a second logic state. The first logic state and the second logic state may correspond to different boolean logic levels. Swapping the primary bit and the secondary bit may include providing a version of the primary bit of each symbol decoded from the one or more signals as a secondary bit of an output symbol, and providing a version of the secondary bit of each symbol decoded from the one or more signals as a primary bit of the output symbol.

Figure 19:
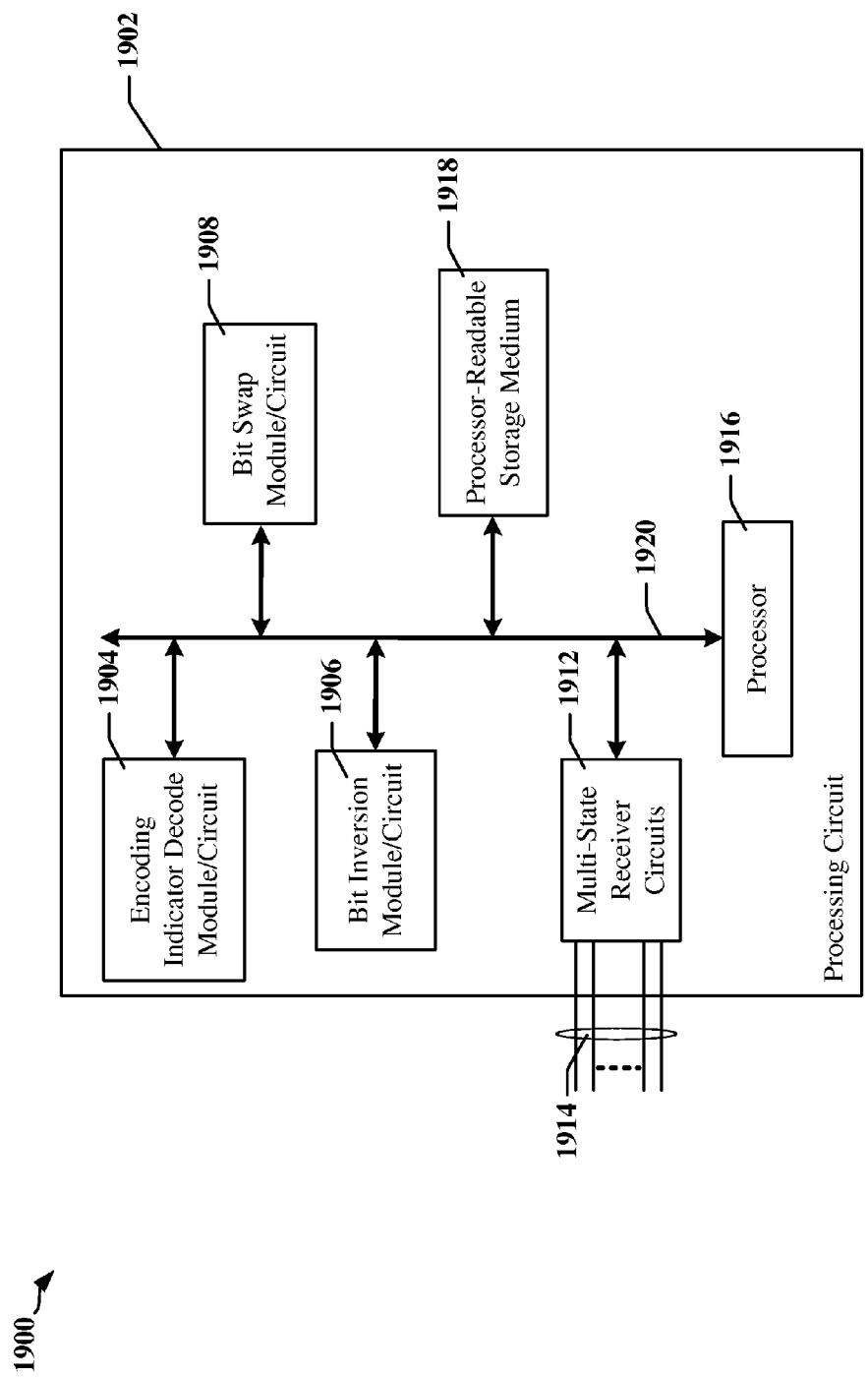
FIG. 19 illustrates an apparatus configured to decode multi-level signals encoded using a combination of data inversion and bit swapping.

FIG. 19 is a diagram illustrating a simplified example of a hardware implementation for an apparatus 1900 employing a processing circuit 1902. The processing circuit 1902 may be implemented with a bus architecture, represented generally by, the bus 1920. The bus 1920 may include any number of interconnecting buses and bridges depending on the specific application of the processing circuit 1902 and the overall design constraints. The bus 1920 links together various circuits including one or more processors and/or hardware modules, represented by the processor 1916, the modules or circuits 1904, 1906 and 1908, multi-state receivers 1912 configurable to receive signals from connectors or wires of a communications link 1914 and the computer-readable storage medium 1918. The bus 1920 may also link various other circuits such as timing sources, peripherals, voltage regulators, and power management circuits, which are well known in the art, and therefore, will not be described any further.

The processor 1916 may include a microprocessor, a controller, a digital signal processor, a sequencer, a state machine, etc. The processor 1916 is responsible for general processing, including the execution of software stored on the computer-readable storage medium 1918. The software, when executed by the processor 1916, causes the processing circuit 1902 to perform the various functions described supra for any particular apparatus. The computer-readable storage medium 1918 may also be used for storing data that is manipulated by the processor 1916 when executing software. The processing circuit 1902 further includes at least one of the modules 1904, 1906 and 1908. The modules 1904, 1906 and/or 1908 may include one or more software modules running in the processor 1916, resident/stored in the computer readable storage medium 1918, one or more hardware modules coupled to the processor 1916, or some combination thereof.

In one configuration, the apparatus 1900 for wireless communication includes means 1904 for decoding a multi-level encoding indicator signal received from a communications link 1914 and configured to provide a plurality of control signals, means 1906 for inverting primary bits and/or secondary bits of data symbols decoded from one or more signals received from the communications link 1914 based on a first and/or second of the plurality of control signals, and means 1908 for swapping the primary bits and the secondary bits based on a third of the plurality of control signals. The aforementioned means may be implemented, for example, using some combination of a processor 206 or 236, physical layer drivers 210 or 240 and storage media 208 and 238.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method performed at a receiving device, comprising:
   decoding a multi-level encoding indicator received from a communications link;
   selectively inverting, using an inverting circuit, a primary bit of data symbols received from the communications link when the multi-level encoding indicator has a first value;
   selectively inverting, using the inverting circuit, a secondary bit of the data symbols when the multi-level encoding indicator has a second value, and
   selectively inverting, using the inverting circuit, the primary bit of the data symbols and the secondary bit of the data symbols when the multi-level encoding indicator has a third value; and
   swapping the primary bit and the secondary bit of the data symbols using a swapping circuit based on information in the multi-level encoding indicator,
   wherein more power is required to transmit the primary bit or the secondary bit in a first logic state than in a second logic state.

2. The method of claim 1, wherein the inverting circuit is disabled when the multi-level encoding indicator has a fourth value.

3. The method of claim 1, wherein decoding the multi-level encoding indicator comprises:
using a decoding circuit to generate a plurality of control signals from the multi-level encoding indicator,
wherein one of the plurality of control signals controls the swapping circuit.

4. The method of claim 1, wherein decoding the multi-level encoding indicator comprises:
using a decoding circuit to generate a plurality of control signals from the multi-level encoding indicator,
wherein a first signal in the plurality of control signals determines whether the primary bit is inverted, and a second signal in the plurality of control signals determines whether the secondary bit is inverted.

5. The method of claim 1, further comprising:
decoding the data symbols from one or more pulse amplitude modulation signals received from the communications link;
providing a version of the primary bit of each symbol decoded from the one or more pulse amplitude modulation signals as a secondary bit of an output symbol; and
providing a version of the secondary bit of each symbol decoded from the one or more pulse amplitude modulation signals as a primary bit of the output symbol.

6. The method of claim 1, wherein the encoding indicator and the data symbols are received from the communications link in pulse amplitude modulation signals having at least 3 levels.

7. An apparatus, comprising:
means for decoding a multi-level encoding indicator received from a communications link;
means for selectively inverting bits of data symbols received from the communications link, including an inverting circuit configured to invert a primary bit of data symbols when the multi-level encoding indicator has a first value, invert a secondary bit of the data symbols when the multi-level encoding indicator has a second value, and invert the primary bit of the data symbols and the secondary bit of the data symbols when the multi-level encoding indicator has a third value; and
means for swapping bits of the data symbols, including a swapping circuit configured to swap the primary bit and the secondary bit based on information in the multi-level encoding indicator,
wherein more power is required to transmit the primary bit or the secondary bit in a first logic state than in a second logic state.

8. The apparatus of claim 7, wherein the inverting circuit is disabled when the multi-level encoding indicator has a fourth value.

9. The apparatus of claim 7, wherein the means for decoding the multi-level encoding indicator includes a decoding circuit configured to:
generate a plurality of control signals from the multi-level encoding indicator,
wherein one of the plurality of control signals controls the swapping circuit.

10. The apparatus of claim 7, wherein the means for decoding the multi-level encoding indicator includes a decoding circuit configured to:
generate a plurality of control signals from the multi-level encoding indicator,
wherein a first signal in the plurality of control signals determines whether the primary bit is inverted, and a second signal in the plurality of control signals determines whether the secondary bit is inverted.

11. The apparatus of claim 7, wherein the means for swapping the primary bit and the secondary bit is configured to:
decode the data symbols from one or more pulse amplitude modulation signals received from the communications link,
wherein the means for swapping bits of the data symbols is configured to:
provide a version of the primary bit of each symbol decoded from the one or more pulse amplitude modulation signals as a secondary bit of an output symbol; and
provide a version of the secondary bit of each symbol decoded from the one or more pulse amplitude modulation signals as a primary bit of the output symbol.

12. The apparatus of claim 7, wherein the multi-level encoding indicator and the data symbols are received from the communications link in pulse amplitude modulation signals having at least 3 levels.

13. A non-transitory processor-readable storage medium having one or more instructions which, when executed by at least one processing circuit, cause the at least one processing circuit to:
decode a multi-level encoding indicator received from a communications link;
selectively invert, using an inverting circuit, a primary bit of data symbols received from the communications link when the multi-level encoding indicator has a first value;
selectively invert, using the inverting circuit, a secondary bit of the data symbols when the multi-level encoding indicator has a second value, and
selectively invert, using the inverting circuit, the primary bit of the data symbols and the secondary bit of the data symbols when the multi-level encoding indicator has a third value; and
swap the primary bit and the secondary bit of the data symbols using a swapping circuit based on information in the multi-level encoding indicator,
wherein more power is required to transmit the primary bit or the secondary bit in a first logic state than in a second logic state.

14. The storage medium of claim 13, wherein the inverting circuit is disabled when the multi-level encoding indicator has a fourth value.

15. The storage medium of claim 13, wherein the instructions cause the at least one processing circuit to:
use a decoding circuit to generate a plurality of control signals from the multi-level encoding indicator,
wherein one of the plurality of control signals controls the swapping circuit.

16. The storage medium of claim 13, wherein the instructions cause the at least one processing circuit to:
use a decoding circuit to generate a plurality of control signals from the multi-level encoding indicator,
wherein a first signal in the plurality of control signals determines whether the primary bit is inverted, and a second signal in the plurality of control signals determines whether the secondary bit is inverted.

17. The storage medium of claim 13, wherein the data symbols are decoded from one or more pulse amplitude modulation signals received from the communications link, and wherein the swapping circuit is configured to:

provide a version of the primary bit of each symbol decoded from the one or more pulse amplitude modulation signals as a secondary bit of an output symbol; and provide a version of the secondary bit of each symbol decoded from the one or more pulse amplitude modulation signals as a primary bit of the output symbol.

18. The storage medium of claim 13, wherein the multi-level encoding indicator and the data symbols are received from the communications link in pulse amplitude modulation signals having at least 3 levels.

19. An apparatus, comprising:
a multi-state decoder configured to decode a multi-level encoding indicator received from a communications link; and
a processing circuit configured to:
selectively invert, using an inverting circuit, a primary bit of data symbols received from the communications link when the multi-level encoding indicator has a first value;
selectively invert, using the inverting circuit, a secondary bit of the data symbols when the multi-level encoding indicator has a second value; and
selectively invert, using the inverting circuit, the primary bit of the data symbols and the secondary bit of the data symbols when the multi-level encoding indicator has a third value; and
swap the primary bit and the secondary of the data symbols using a swapping circuit based on information in the multi-level encoding indicator,
wherein more power is required to transmit the primary bit or the secondary bit in a first logic state than in a second logic state.

20. The apparatus of claim 19, wherein the inverting circuit is disabled when the multi-level encoding indicator has a fourth value.

21. The apparatus of claim 19, wherein the multi-state decoder is configured to:
generate a plurality of control signals from the multi-level encoding indicator,
wherein one of the plurality of control signals controls the swapping circuit.

22. The apparatus of claim 19, wherein the multi-state decoder is configured to:
generate a plurality of control signals from the multi-level encoding indicator,
wherein a first signal in the plurality of control signals determines whether the primary bit is inverted, and a second signal in the plurality of control signals determines whether the secondary bit is inverted.

23. The apparatus of claim 19, wherein the multi-state decoder is configured to:
decode the data symbols from one or more pulse amplitude modulation signals received from the communications link, and
wherein the swapping circuit is configured to:
provide a version of the primary bit of each symbol decoded from the one or more pulse amplitude modulation signals as a secondary bit of an output symbol; and
provide a version of the secondary bit of each symbol decoded from the one or more pulse amplitude modulation signals as a primary bit of the output symbol.

24. The apparatus of claim 19, wherein the multi-level encoding indicator and the data symbols are received from the communications link in pulse amplitude modulation signals having at least 3 levels.

\* \* \* \* \*